United States Patent
Baker et al.

(10) Patent No.: US 12,367,134 B2
(45) Date of Patent: *Jul. 22, 2025

(54) COMPUTER ARCHITECTURE WITH DISAGGREGATED MEMORY AND HIGH-BANDWIDTH COMMUNICATION INTERCONNECTS

(71) Applicant: Luminous Computing, Inc., Santa Clara, CA (US)

(72) Inventors: David Cureton Baker, Austin, TX (US); Ari Novack, New York, NY (US); Donovan Popps, Austin, TX (US); Benjamin Wiley Melton, Thousand Oaks, CA (US); Bryan Cope, Austin, TX (US); Mark Baur, Austin, TX (US); Anahita Shayesteh, Los Altos, CA (US)

(73) Assignee: Luminous Computing, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/478,576

(22) Filed: Sep. 29, 2023

(65) Prior Publication Data
US 2024/0079081 A1    Mar. 7, 2024

Related U.S. Application Data

(63) Continuation-in-part of application No. 18/096,740, filed on Jan. 13, 2023, now Pat. No. 12,117,930, and
(Continued)

(51) Int. Cl.
*G06F 12/02* (2006.01)
*G06F 13/16* (2006.01)
*G11C 29/52* (2006.01)

(52) U.S. Cl.
CPC ...... *G06F 12/0238* (2013.01); *G06F 13/1668* (2013.01); *G11C 29/52* (2013.01)

(58) Field of Classification Search
None
See application file for complete search history.

(56) References Cited

U.S. PATENT DOCUMENTS

| 8,422,314 | B2 | 4/2013 | Lee |
| 2014/0059286 | A1 | 2/2014 | Matsuo et al. |
| 2022/0114121 | A1 | 4/2022 | Thakur et al. |

*Primary Examiner* — Charles J Choi
(74) *Attorney, Agent, or Firm* — Stratford Group Ltd

(57) ABSTRACT

Conventional high performance computer connections are electron-based systems, which require the memory packages to be as close as mechanically possible to the computation engine. Low power and high bandwidth long distance communication, e.g. photonic or electronic, links can drastically change the architecture of high-performance computers by eliminating the bottlenecks in communication. A computer system comprises: a plurality of memory aggregation devices configured to retrieve data from and store data in a plurality of random access memory modules forming a unified contiguous memory address space disaggregated from a processing unit; one or more computational devices configured for simultaneously launching a plurality of data signals including memory read and/or write requests for the data to the plurality of memory aggregation devices; and a plurality of communication links coupling each of the plurality of memory aggregation devices to each of the one or more computational devices for transferring the data therebetween.

19 Claims, 24 Drawing Sheets

Related U.S. Application Data a continuation-in-part of application No. 18/149,013, filed on Dec. 30, 2022, now Pat. No. 12,099,724.

(60) Provisional application No. 63/374,703, filed on Sep. 6, 2022, provisional application No. 63/374,705, filed on Sep. 6, 2022, provisional application No. 63/374,710, filed on Sep. 6, 2022, provisional application No. 63/374,713, filed on Sep. 6, 2022, provisional application No. 63/374,689, filed on Sep. 6, 2022.

FIG. 14

32-bit EMBEDDING TABLE
OFFSET INTO REMOTE DRAM

| 0 | OFFSET 3 3 3 2 2 2 2 2 2 2 2 2 2 1 1 1 1 1 1 1 1 1 1 9 8 7 6 5 4 3 2 1 0 | 1 0 9 8 7 6 5 4 3 2 1 0 9 8 7 6 5 4 3 2 1 0 |

32-bit EMBEDDING TABLE
OFFSET INTO LOCAL SRAM

| 1 | OFFSET 3 3 3 2 2 2 2 2 2 2 2 2 2 1 1 1 1 1 1 1 1 1 1 9 8 7 6 5 4 3 2 1 0 | 1 0 9 8 7 6 5 4 3 2 1 0 9 8 7 6 5 4 3 2 1 0 |

FIG. 18

VPU END POINT ADDRESS -- SRAM

| BOX_SEL[12:0] | CHIP ID [7:0] | 1xx | END POINT ID [6:0] | VPU or SCRATCH SRAM |

VPU END POINT ADDRESS -- ILM

| BOX_SEL[12:0] | CHIP ID [7:0] | 1xx | END POINT ID [6:0] 001 | VPU ILM |

VPU END POINT ADDRESS -- DLM

| BOX_SEL[12:0] | CHIP ID [7:0] | 1xx | END POINT ID [6:0] 010 | VPU DLM |

VPU END POINT ADDRESS -- PROGRAMABLE REGISTER

| BOX_SEL[12:0] | CHIP ID [7:0] | 1xx | END POINT ID [6:0] 011 | AXI/AHB/APB Device |

COMPUTATIONAL DEVICE CHIP LEVEL END POINT

| BOX_SEL[12:0] | CHIP ID [7:0] | 0xx | END POINT ID [6:0] | SCRATCH SRAM or APB |

BRIDGE DEVICE CHIP LEVEL END POINT

| BOX_SEL[12:0] | CHIP ID [2:0] | AXI ADDRESS |

COMPUTER ARCHITECTURE WITH DISAGGREGATED MEMORY AND HIGH-BANDWIDTH COMMUNICATION INTERCONNECTS

TECHNICAL FIELD

The present disclosure relates to computer architecture, and in particular to computer architecture with communication, e.g. photonic, interconnects providing a unified contiguous memory address space disaggregated from any number, e.g. one or more or a plurality, of processing units, e.g. central processing units or AI training accelerators.

BACKGROUND

Conventional computer architectures are designed around the assumption that long distance communication is difficult and costly, with diminishing performance at scale because typical computers use electrical signals, which consume significant energy the further the transmission. Accordingly, large amounts of time, money, and effort are spent molding software around hardware to compensate for bottlenecks in communication. Thanks to slow communication links, the largest recommendation systems spend more time communicating than computing, while large language models take months to tune for maximum performance. This results in systems, both large and small, that must employ complicated strategies for optimizing performance, e.g. for modern AI models or other large-scale compute problems. With the advent of cutting-edge silicon photonics and high-performance interconnects, data links can be built that are orders of magnitude more bandwidth-dense and power-efficient than have ever been possible. Communication is simply no longer the bottleneck for scaling and performance. Breaking these bandwidth bottlenecks enables fundamental assumptions about computer architecture to be revisited at the hardware, software, and for machine learning, even the model level. In particular, modern systems must employ both complicated memory and bandwidth hierarchies that must be accounted for when optimizing SW to operate on them, and must also dramatically increase the complexity of the silicon packaging utilized for their digital chips via chiplet, substrate-interposer-silicon, and chip-on-wafer-on-silicon (CoWoS) architectures. In principle, both sets of techniques are meant to address the engineering challenges behind delivering high bandwidth across the system, but the silicon-packaging techniques specifically push towards the use of High-Bandwidth-Memory (HBM), a technology that allows for memory to be integrated in the same package as the compute chips, though at a significant cost in terms of ultimate memory capacity. Depending on the distance or reach required, the advent of very high-speed serial interfaces in either electric or photonic media provide significant opportunities for new architectures with efficient disaggregation of memory subsystems from processors.

The state of the art for high performance computer connections in electron-based systems is embodied in the High-Bandwidth-Memory (HBM) dynamic random access memory (DRAM) memory chips found in general purpose computer architectures and special purpose ones like graphic processing units (GPUs) of today. The HBM approach is to place the HBM memory packages as close as mechanically possible to the computation engine, e.g. the GPU or the central processing unit (CPU). In addition, the HBM memory architecture depends heavily on very wide data busses, e.g. 1024 bits and limit clock speeds to near the physical limits for electronic interfaces. Representative systems are A100, H100 GPUs and EPYC CPUs. For electronic based interconnects, distance off the board means severe throughput and latency limitations. A technique for resolving these critical issues in computer hardware design, useful at any scale of system, involves the creation of physical disaggregation of memory from compute, enabling high bandwidth at large capacity via the use of parallel-access DRAM with automatic packet interleaving. Another technique primarily useful at multi-device scales involves the use of optical interfaces to provide extremely high-bandwidth data transfer over long distances. Together these techniques may be used to create systems at any scale that offer significant advantages over what is possible today, and solve the longstanding memory and data throughput (von Neumann) bottleneck, enabling highly-efficient utilization of compute capacity, especially for large compute tasks, such as the operation and training of AI models.

An object of the present disclosure is to provide low power and high bandwidth-density communication, e.g. photonic, links to drastically change the architecture of high-performance computers by providing a unified contiguous memory address space disaggregated from a processing unit.

SUMMARY

Accordingly, a first apparatus includes a computer system comprising:
a plurality of memory aggregation devices configured to retrieve data from and store data in a plurality of random access memory modules forming a unified contiguous memory address space disaggregated from a processing unit;
one or more computational devices configured for simultaneously launching a plurality of data signals including memory read and/or write requests for the data to the plurality of memory aggregation devices;
a plurality of communication links, the plurality of communication links coupling each of the plurality of memory aggregation devices to each of the one or more computational devices via the switching system for transferring the data therebetween;
wherein the one or more computational devices are configured to read/write multiple read/write requests simultaneously in parallel across the unified contiguous memory address space in the plurality of memory modules via the plurality of memory aggregation devices.

According to any of the aforementioned embodiments the computer system may further comprise bridge devices configured to connect to a computer motherboard interface configured for converting the data between electrical signals in packet form from a host computer and optical signals in packet form, compatible with the plurality of communication links.

According to any of the aforementioned embodiments the plurality of communication links connected to the plurality of memory aggregation devices may provide substantially all of an available read/write bandwidth of the plurality of random access memory modules to be accessed simultaneously.

According to any of the aforementioned embodiments one or more of the plurality of communication links may comprise one transmitter (TX) electronic link and one receiver (RX) electronic link.

According to any of the aforementioned embodiments one or more of the plurality of communication links may comprise a transmitter optical and/or electrical link and a receiver optical and/or electrical link; and each transmitter (TX) optical and/or electrical link and each receiver (RX) optical and/or electrical link may comprise a serializer and a first transducer for converting the data from parallel electrical signals to serial optical signals for transmission on an optical waveguide; and a deserializer and second transducer for converting the serial optical signals into parallel electrical signals at the computational devices and the memory aggregation devices.

According to any of the aforementioned embodiments each computational device may include a memory copy engine configured to move the data over the communication links from any memory in any of the one or more computational devices, the plurality of memory aggregation devices and the plurality of random access memory modules to anywhere in the plurality of random access memory modules.

According to any of the aforementioned embodiments each memory copy engine (MEMCPY) may be configured to divide transfers of data into packets and to dispatch the packets over multiple communication links in parallel and substantially simultaneously to a plurality of the plurality of memory aggregation devices for uniformly storing in the plurality of random access memory modules.

According to any of the aforementioned embodiments the one or more computational devices may comprise at least eight computational devices;
 wherein the plurality of memory aggregation devices may comprise at least eight memory aggregation devices;
 wherein each memory copy engine may be configured to launch at least sixteen memory read requests or write transactions in parallel and substantially simultaneously to each memory aggregation device over the communication links there between.

According to any of the aforementioned embodiments may further comprise a switching system configured to provide any to any switching of the data signals between the one or more computational devices and the plurality of memory aggregation devices; and wherein the switching system may comprise a plurality of switch devices, one switch
 device for each of the one or more computational devices.

According to any of the aforementioned embodiments each switch device may include at least four switch planes;
 wherein each computational device may include at least four communication links extending to each switch device, one communication link to each switch plane;
 wherein each memory aggregation device may have at least four communication links extending thereto from one of the switch devices, one communication link from each of the switch planes.

According to any of the aforementioned embodiments the memory modules may include 4-8 memory modules per memory aggregation device.

According to any of the aforementioned embodiments the plurality of random access memory modules may comprise at least 100 GB of DRAM memory.

According to any of the aforementioned embodiments at least one of the plurality of switch devices may be integrated on a same combination chip as at least one of the one or more computational devices.

According to any of the aforementioned embodiments the data is bussed in one source clocked data bus that runs around a periphery of each combination chip, whereby no paths cross through the middle of the combination chip.

According to a second apparatus a computer system comprises:
 a plurality of memory aggregation devices configured to retrieve data and store data from a plurality of random access memory modules;
 a plurality of memory copy engines (MEMCPY) that launch a plurality of memory read and/or write requests for the data to the plurality of memory aggregation chips;
 a plurality of communication links, the plurality of communication photonic links optically coupling each of the plurality of memory aggregation devices to each of the plurality of memory copy engines According to any of the aforementioned embodiments at least some of the plurality of memory copy engines (MEMCPY) may be co-located with processing cores that are configured to compute data.

According to any of the aforementioned embodiments at least some of the plurality of memory copy engines (MEMCPY) may be co-located with bridge devices that are configured to communicate with other processors using a standard interface.

According to any of the aforementioned embodiments greater than ⅔ of available random access memory in the plurality of random access modules may be accessible via the plurality of memory aggregation devices accessible via the plurality of communication links.

According to any of the aforementioned embodiments the communication links connected to each of the plurality of memory aggregation devices may provide >⅔ of an available read/write bandwidth of the plurality of random access memory modules.

According to any of the aforementioned embodiments the plurality of MEMCPY engines may be configured to access greater than ⅔ an available read/write bandwidth of the plurality of random access memory modules in parallel and uniformly.

According to any of the aforementioned embodiments the computer system may further comprise: a switching system configured to provide any to any switching of data between the plurality of MEMCPY engines and the plurality of memory aggregation devices.

According to any of the aforementioned embodiments the plurality of MEMCPY engines may be configured for memory interleaving, which is globally applied across all of the plurality of memory modules via the plurality of memory aggregation devices.

According to any of the aforementioned embodiments a combination of the plurality of MEMCPY engines, the plurality of memory aggregation devices, and the switching system, may provide a uniform memory to all of the plurality of MEMCPY engines.

According to any of the aforementioned embodiments a total random access memory capacity across all of the plurality of memory modules via the plurality of memory aggregation devices may be greater than 100 GB.

According to any of the aforementioned embodiments a total random access memory capacity across all of the plurality of memory modules via the plurality of memory aggregation devices may be greater than 2 TB.

According to any of the aforementioned embodiments the total random access memory capacity may be greater than 1 PB.

According to any of the aforementioned embodiments the plurality of MEMCPY engines may be configured to access all of the plurality of memory modules via all of the plurality of memory aggregation devices in a unified, contiguous address space.

According to any of the aforementioned embodiments the plurality of MEMCPY engines may be configured to read/write multiple requests in parallel to all of the plurality of memory aggregation devices across a unified contiguous memory address space in the plurality of memory modules.

According to any of the aforementioned embodiments the computer system may further comprise accelerators configured for executing artificial intelligence algorithms stored on non-transitory memory.

BRIEF DESCRIPTION OF THE DRAWINGS

Some example embodiments will be described in greater detail with reference to the accompanying drawings, wherein:

FIG. 14 are schematic diagrams of 32-bit index offsets, e.g. embedding table offsets in large recommendation models, for remote DRAM and local SRAM;

FIG. 18 is a schematic diagram of exemplary endpoint address formats in accordance with the present disclosure.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Several techniques for resolving critical issues in computer hardware design will be presented herein. One technique, useful at any scale of system, involves the creation of physical disaggregation of memory from compute, enabling high bandwidth at large capacity via the use of parallel-access DRAM with automatic packet interleaving. Another technique primarily useful at multi-device scales involves the use of optical interfaces to provide extremely high-bandwidth data transfer over long distances. Together these techniques may be used to create systems at any scale that offer significant advantages over what is possible today, and solve the longstanding memory and data throughput (von Neumann) bottleneck, enabling highly-efficient utilization of compute capacity, especially for large compute tasks, such as the operation and training of AI models.

Figure 1:
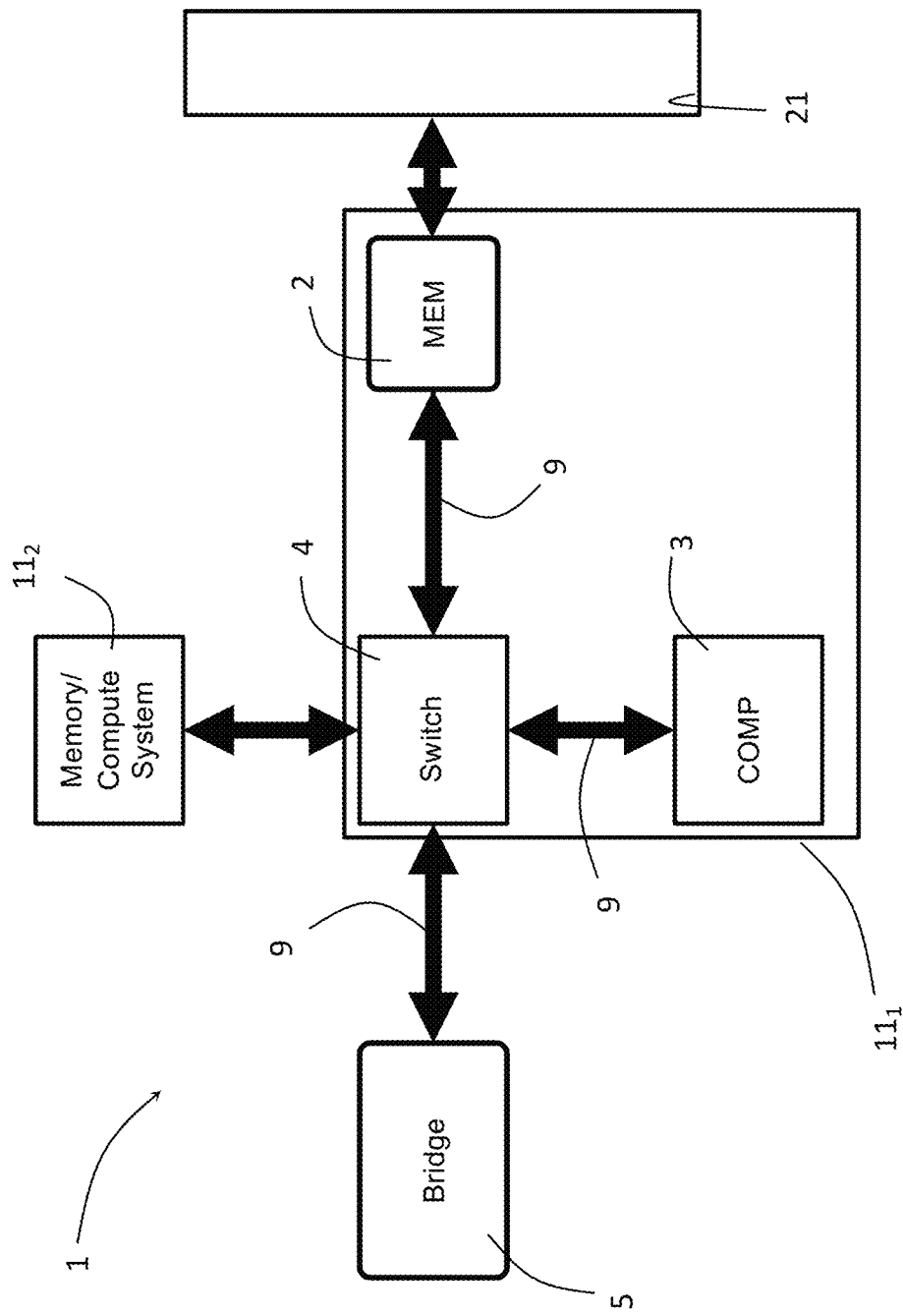
FIG. 1 is a schematic diagram of an exemplary computer system in accordance with the present disclosure.

With reference to FIG. 1, an exemplary embodiment of a computer system 1 comprises a first memory rack unit $11_1$ including a plurality of, e.g. four or more, digital devices or chips, e.g. memory aggregation devices or chips 2, computational devices or chips 3, a switching system comprising a plurality of switch devices, e.g. switch chips 4, and bridge devices or chips 5. The various devices or chips 2 to 5 are interconnected with very high-performance communication links 9, each communication link 9 may comprise a pair of optical and/or electrical links 900, each optical and/or electrical link 900 comprising one transmitter (TX) optical and/or electrical link interface 901, one receiver (RX) optical and/or electrical link interface 902, and an optical waveguide 903, e.g. 56 GB/s optical fibers, or integrated waveguide, therebetween, as discussed herein with reference to FIG. 4A. Alternatively, the communication links 9 may comprise electronic links or a combination of electronic links and photonic links. One or more of the memory aggregation devices 2, the computational devices 3, some or all of the switching system comprising the plurality of switch devices 4, and the bridge devices 5 may be provided on the same chip or multiple independent chips.

The memory aggregation devices 2 are configured to connect a plurality of memory modules 21, e.g. at least four Double Data Rate 5 (DDR5) Dual In-line Memory Module (DIMMs), to a plurality of the communication links 9, e.g. at least sixteen optical and/or electrical link pairs, extending to the switch system, e.g. the plurality of switch devices 4 forming a unified contiguous memory address space disaggregated from a processing unit.

Each computational device 3 may comprise a memory access engine, namely a memory copy (MEMCPY) engine, that can read and write from local memory without intervention from processors, and a plurality of processors, e.g. 4-64, preferably more than 64, reduced instruction set computer vector (RISC V) processors, along with a plurality of General Matrix Multiply (GEMM) systolic arrays, e.g. 2-8, but preferably more than 8. Alternatively, the computational devices 3 may only comprise only the MEMCPY engine, for example, in the form of a MEMCPY I/O chiplet connected to external processor chiplets. The key thing is that the primary function of the MEMCPY engine is data movement and not mathematical operations.

The MEMCPY engine is a feature of the computer system 1 and enables the computation devices 3 to access all of the plurality of disaggregated memory modules 21 via the memory aggregation devices 2 independently of a processing unit, e.g. central processing unit (CPU) or AI training accelerator, which may or may not be provided in the computation devices 3 or external to the computer system 1. Without the MEMCPY engine, when the processing unit is inputting or outputting data it is typically fully occupied for the entire duration of the read or write operation, and is thus unavailable to perform other tasks. With the MEMCPY engine, the processing unit may first initiate the transfer of the data, then perform other operations while the transfer is in progress. The processing unit may then receive a message from the MEMCPY engine when the transfer is completed.

Accordingly, the one or more computational devices 3 are configured to read/write multiple read/write requests simultaneously in parallel across the unified contiguous memory address space in the plurality of memory modules 21 via the plurality of memory aggregation devices 2. The MEMCPY engines are configured to access at least ⅔ but preferably substantially all of an available read/write bandwidth of the plurality of random access memory modules 21 in parallel and uniformly.

The switch devices 4 may comprise a plurality of pairs of optical and/or electrical link interfaces 901/902, e.g. up to 368 or more, essentially providing the required any to any switching of optical signals, e.g. packets, between the computational devices 3, the memory aggregation devices 2, and the bridge devices 5, via the communication links 9. The switch devices 4 may also connect the first compute/memory system $11_1$ with other compute/memory systems, e.g. a second compute/memory system $11_2$.

The bridge devices 5 are configured to connect the optical computer system including a network of the communication links 9 to a computer motherboard interface, e.g. a PCI express (PCIe) socket, in a host server motherboard or PCIe switch backplane. In some embodiments, some of the bridge device 5 may include a MEMCPY engine, as hereinbefore described.

Accordingly, the computer system 1 is a disaggregated system in which multiple processors 3 share the same memory 21 which may be housed at different distances, including some farther away than others. The computer system 1 may be a uniform system, so that the bandwidth is balanced everywhere, i.e. computational devices 3, memory aggregation devices 2, switch devices 4 via communication, e.g. photonic, links 9. The computer system 1 may be unified and interleaved over a very large scale, which facilitates communication Moreover, all of the memory 21 is accessible via an integrated on-chip memory engine 75.

Figure 2:
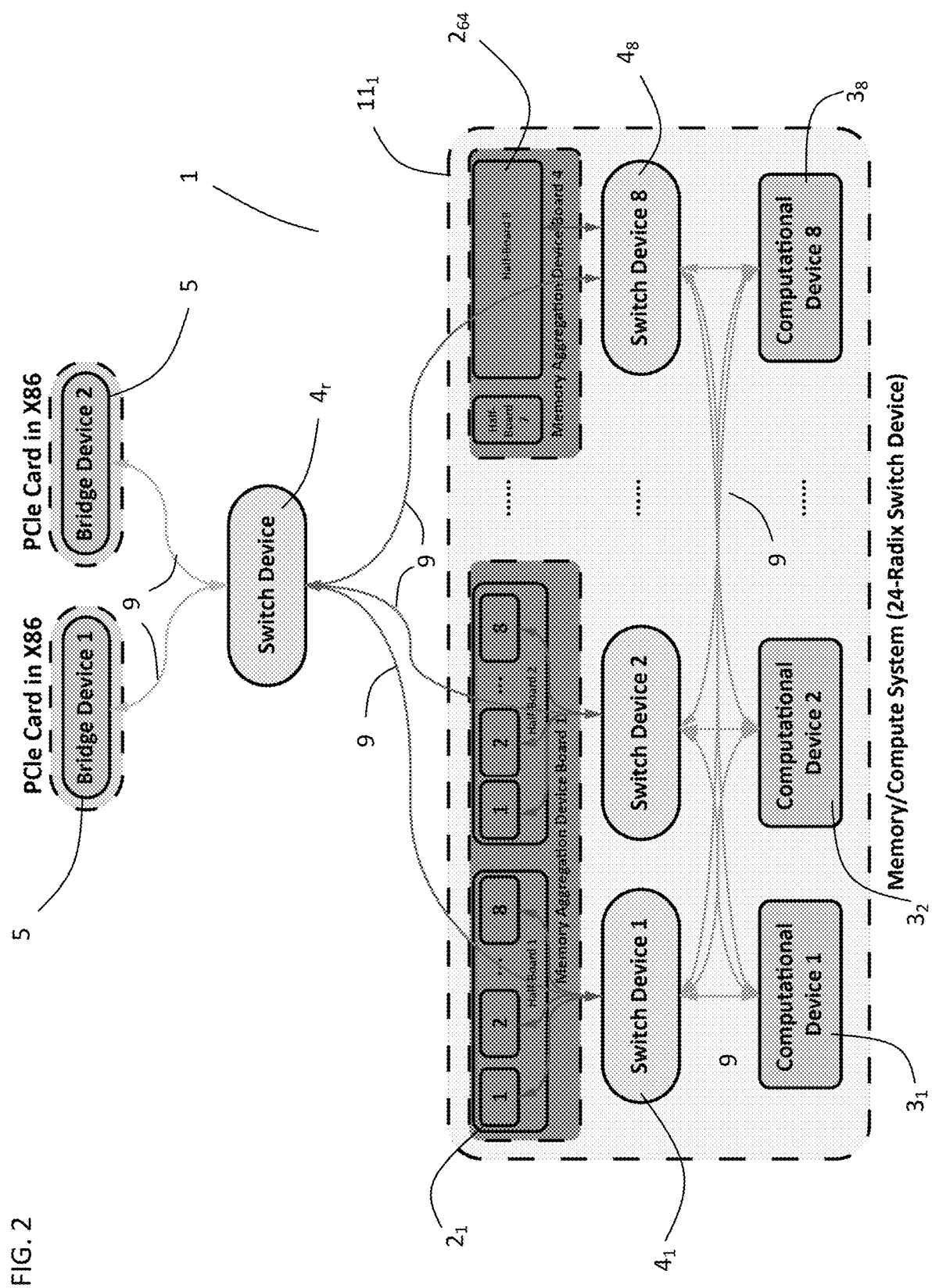
FIG. 2 is a schematic diagram of an exemplary computer system in accordance with the present disclosure.

With reference to FIG. 2: an exemplary computer system 1 includes a single first compute/memory system $11_1$ comprising: eight computational devices or chips $3_1$ to $3_8$; eight switch devices or chips $4_1$ to $4_8$; 64 memory aggregation devices $2_1$ to $2_{64}$, i.e. eight memory aggregation devices 2 per switch device $4_1$ to $4_8$, with each memory aggregation device 2 connecting to four memory modules 21, e.g. 256 DDR5 DIMMs; and two bridge devices 5, e.g. PCIe bridge chips, connected via a ninth (optical relay or second tier) switch device $4_r$ to the other 8 switch devices $4_1$ to $4_8$ via communication links 9. Although more or less of each of the device components 2-5 and more memory rack units 21 are possible. Some of the communication links 9 may be photonic links or electronic links, if the device components 2-5 are in close enough proximity.

Figure 3:
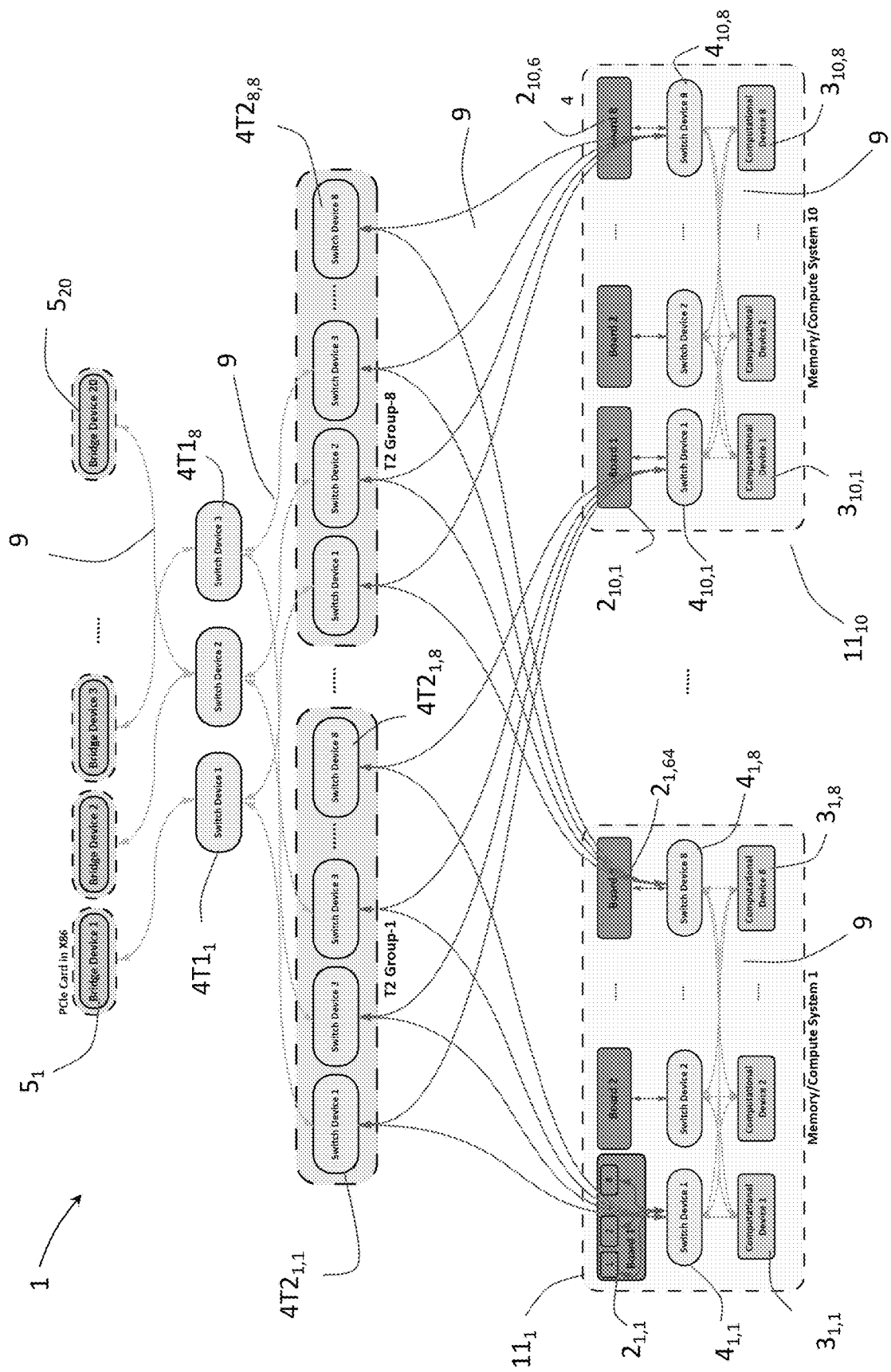
FIG. 3 is a schematic diagram of an exemplary computer system in accordance with the present disclosure.

While FIGS. 1 and 2 illustrate exemplary embodiments of the computer system 1 with one memory/compute system 1 (FIG. 2) or two memory/compute systems $11_1$ and $11_2$ (FIG. 1); FIG. 3 illustrates a more complex exemplary embodiment of the computer system 1 comprising a plurality of memory/compute systems $11_1$ to $11_n$ (n=10 in the example) connected in a "cluster", with up to eight or more switch devices ($4_{1,1}$ to $4_{10,8}$) and about the same number of, e.g. up to eight or more, computational devices ($3_{1,1}$ to $3_{10,8}$) per memory/compute system $11_1$ to $11_{10}$, and about the same number, e.g. up to eight or more, memory aggregation devices $2_{1,1}$ to $2_{10,64}$ per switch device $4_{1,1}$ to $4_{10,8}$ with each aggregation device $2_{1,1}$ to $2_{10,64}$ connecting to at least four memory modules 21. Each memory/compute system $11_1$ to $11_n$ has a corresponding tier 2 switch group $4T2_1$ to $4T2_8$ with eight switches per switch group $4T2_{1,1}$ to $4T2_{8,8}$. Each computer system 1 has a plurality of tier 1 switches, e.g. $4T1_1$ to $4T1_8$. Moreover, each computer system 1 includes a plurality of bridge devices 5, e.g. $5_1$ to $5_{20}$, connecting the tier 1 switches $4T1_1$ to $4T1_8$ to external computer processors.

Even larger systems are possible thanks to the performance and low power nature of the communication links 9. In the prior art, these systems at these scales are interconnected with traditional ethernet. Even with photonic implementations of ethernet the power is quite large due to the need to run long distances and the bandwidth is largely wasted due to high level TCP/IP protocols, which also greatly increase the latency. With photonics and the computer system 1 all these limitations are avoided, as all the device components 2-5 are connected with low power high performance-density communication links 9. Accordingly, the computer system 1 is configured to enable access to massive, uniform and continuous memory 21 with no access bottleneck, i.e. all computational devices 3 "see" and have access to a huge bank of available memory 21, which is a massive disaggregated, uniform, interleaved, memory bank. The plurality of communication links 9 connected to the plurality of memory aggregation devices 2 provide at least ⅔, but preferably substantially all of an available read/write bandwidth of the plurality of random access memory modules 21 to be accessed simultaneously.

Figure 4A:
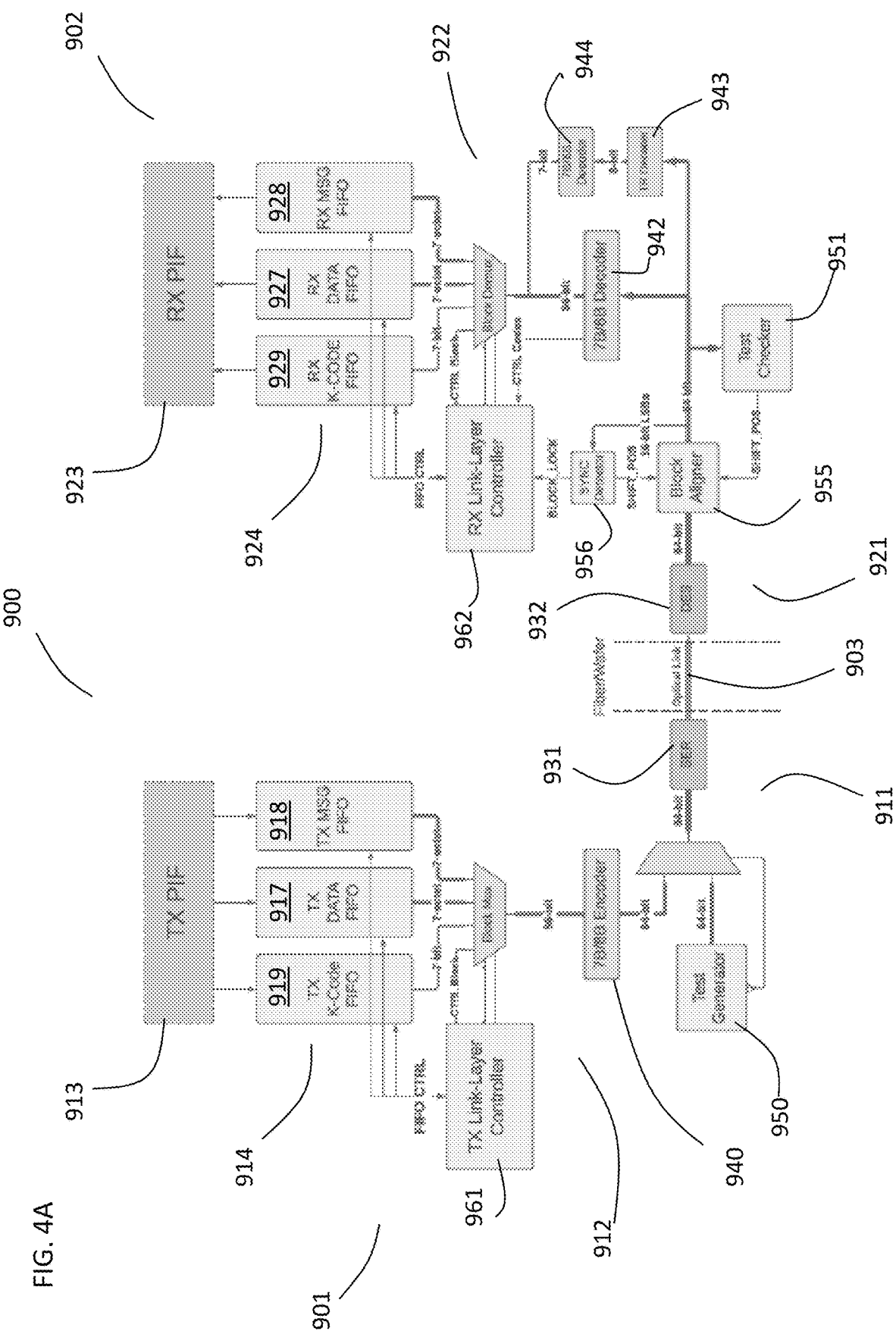
FIG. 4A is a schematic diagram of an exemplary link in accordance with the present disclosure.

With reference to FIG. 4A, high-speed data transfer between discrete devices, e.g. the aggregation devices 2, the computation devices 3, the switch devices 4, and the bridge devices 5, within the computer system 1 is implemented using the communication links 9. The communication links 9 may use a combination of photonics or electronics with specialized RF modules, and high-speed digital modules to realize a point-to-point, high-speed interface that can support transfer over a relatively long distance, e.g. 1 m to 100 m, preferably 5 m to 20 m. The TX and RX physical optical interfaces 901 and 902, respectively, are grouped in pairs (only one of two shown in FIG. 4A) to support high-speed transfers in both directions, e.g. the memory aggregation devices 2 implement 32 pairs of the TX and RX optical and/or electrical link interfaces 901 and 902, which are mainly used to service large memory requests between the computational devices 3 and the memory modules 21 (DRAM). The high-speed digital portions of the TX and RX optical and/or electrical link interfaces 901 and 902 may be implemented within each memory aggregation device 2.

The TX optical and/or electrical link interfaces 901 may comprise three sections: a TX physical layer interface (TX PHY) 911; a TX link layer 912; and a TX packet interface (TX PIF) module 913. The RX optical and/or electrical link interfaces 902 comprise three sections: an RX physical layer interface (RX PHY) 921; an RX link layer 922; and an RX packet interface (RX PIF) module 923.

The TX PHY 911 provides a physical connection to the optical waveguide 903 and the optical computer system 1, e.g. for the memory aggregation devices 2 the TX PHY 911 is optically coupled to one of the computation devices 3 via one of the switch device 4. The TX PHY 911 includes SERDES transceiver including an optical transmitter, e.g. a CW laser configured for generating an input optical signal, an optical modulator configured for converting the input optical signal into a modulated output optical data signal based on a modulated RF electrical data signal, and a serializer 931 configured to transform parallel optical data signals into serial optical data signals for transmission on the optical waveguide 903, and the RX PHY 921 includes a receiver, e.g. photodetectors, and a deserializer 932 portion of a SERDES transceiver configured to transform serial optical or electrical data signals into parallel electrical data signals for the corresponding device component 2-5. The serializer 931 of the TX PHY 911 and the deserializer 932 of the RX PHY 921 may be used with a variety of PHYs, encoding strategies, or speeds, for example: running at 28 Gbps, 32 Gbps, 56 Gbps, 112 Gbps, 224 Gbps, 448 Gbps, with NRZ, PAM4, PAM8, encoding, or over USR, XSR, SR, VSR, MR, LR, or UCIe PHYs, but they may also use PHYs, modulation, encoding strategies, or speeds not listed here. The serializer 931 of the TX PHY 911 and the deserializer 932 of the RX PHY 921 may be using a 56 Gbps protocol or higher, such as a 56 Gbps NRZ protocol over a XSR physical interface. XSR is an extremely short reach, Optical Internetworking Forum (OIF) standard for physical die-to-die serial interconnect. The photonic components, e.g. optical transmitters and optical modulators, may be replaced with electronic components for electronic communication links 9. Such replacement may be advantageous over short distances. A combination of short-distance electrical and longer-distance optical communication links may also be used.

The TX link layer 912 interfaces to the TX PHY 911, and may synchronize, and provides low-level framing and signal recovery. The RX link layer 922 may provide line coding, framing, multiple data channel interleaving, and error checking for the RX optical and/or electrical link interface 902. The RX link layer 922 also interfaces with the RX PIF module 923.

The TX PIF module 913 may provide network layer packetization and error checking and interfaces with the internal chip fabric to retrieve data from the memory modules 21, which is routed to the TX PHY 911. The RX PIF module 923 provides network layer packetization and error checking and interfaces with the internal chip fabric to store data to the memory modules 21, which is routed from the RX PHY 921. The TX link layer 912 may connect to the TX PIF module 913 through a TX buffer 914. The RX link layer 922 may connect to the RX PIF module 923 through an RX buffer 924.

In some exemplary embodiments there are 32 TX/RX pairs of TX and RX optical and/or electrical link interfaces 901 and 902 on each memory aggregation device 2, and 16 pairs are connected to one of two TX PHY 911 and RX PHY 921 (FIGS. 6A and 6B), e.g. Synopsys PCS PHY blocks. Accordingly, the memory modules 21, e.g. DRAM, and the computation logic, i.e. the computational devices 3 can be disaggregated at great distances, e.g. up to 10 m or more, from each other using photonic interconnect technology.

An exemplary embodiment utilizes a DesignWare® USR/XSR PHY IP for 112 Gbps per lane die-to-die connectivity enables high-bandwidth ultra- and extra-short-reach interfaces in multichip modules (MCMs) for hyper-scale data center, AI, and networking applications. The low-latency, low-power, and compact TX PHY 911 and RX PHY 921 supports NRZ and PAM-4 signaling from 2.5-G to 112-G data rates and is compliant with the OIF CEI-112G and CEI-56G standards for ultra-short-reach (USR) and extra-short-reach (XSR) links. The TX PHY 911 and RX PHY 921 offers flexible layout for maximum bandwidth per die-edge by allowing placement of the square macros along all edges of the die. The TX PHY 911 and RX PHY 921 deploys 16-lane transmit and receive macros for optimized segmentation on the multiple dies. The robust DLL-based clock-forwarded architecture enables high energy efficiency while supporting reliable links of up to 50 millimeters for large MCMs. The TX PHY 911 and RX PHY 921 enables multi-die connectivity over organic substrates, which helps reduce packaging costs without requiring advanced interposer-based packaging over shorter distances. The embedded bit error rate (BER) tester and nondestructive 2D eye monitor capability provide on-chip testability and visibility into channel performance. Besides the PMA and PMD, the TX PHY 911 and RX PHY 921 includes a raw-PCS to facilitate the interface with the on-chip network, regardless of the existing networking protocol. The USR/XSR IP is combined with Synopsys' comprehensive routing feasibility analysis, packages substrate guidelines, signal and power integrity models, and crosstalk analysis for fast and reliable integration into SoCs. Other serialization standards and strategies are within the scope of the invention, including other XSR (extreme short reach), MR (medium reach) and LR (long reach) standards for both photonic and electronic communication links 9.

The RX PIF 923 interfaces with the RX link layer 924 and performs data transfers between the RX link layer 924 and the internal components of the memory aggregation device 2. The RX link layer 924 may provide three separate types of data: bulk data; message data; and K-code data. The RX path of the RX link layer 924 and the RX PIF 923 receive data into the memory aggregation device 2 from the optical and/or electrical link 900 via the RX PHY 921. The TX path of the TX link layer 912 and the TX PIF 913 transfer data from the memory aggregation device 2 into the optical and/or electrical link 900 via the TX PHY 911.

A memory copy (MEMCPY) packet structure or a direct memory access (DMA) packet structure may be used to collect the bulk data and transaction information between the TX PIF 913 and the TX link layer 912, and between the RX PIF 923 and the RX link layer 922. Bulk data payloads can be from 1 to 4096 bytes of data. Message data may be sent within a similar packet format but with less transaction information. Message data payloads may be limited to 64 B of data. The message data packets are used for small network layer messages relating to the interface. A PIF interface may be used to send small, 7-bit code with minimal latency between the TX PIF 913 and connected interfaces with the RX PIF 923. These codes are used primarily for bulk data and message transfer acknowledgments.

In some embodiments, the communication link 9 may utilize a block-oriented protocol composed of eight 7b/8b (64-bit) symbols, yielding 7-octet (56-bit) blocks, but other coding and protocols are within the scope of the invention. The control symbols, CTRL and SEP, are arranged in patterns to denote the type and structure of blocks. The redundancy and arrangement of these symbols in the block are chosen to maximize the robustness and resilience of the protocol to errors in the bitstream. The control protocol is designed to be resilient to burst errors at least 8 bits long. Each block is categorized as either data, separator, or control. Data and separator blocks form the framing structure of the protocol. Control blocks manage the state and flow control features of each link. Every control block starts with a 16-bit SYNC sequence. This sequence is unique and does not appear anywhere else in any block. It is used for initial block synchronization and verification at runtime. Data frames consist of data and separator blocks. A separator block is a control block that terminates an active frame.

An encoder 940 in the TX optical and/or electrical link interface 901 encodes every 7 bits of a 56-bit input block into 8-bit symbols of a 64-bit output block. The decoder 942 in the RX optical and/or electrical link interface 902 decodes every 8-bit symbol of a 64-bit input block into 7 bits of a 56-bit output block. The input to the 7b/8b encoder 940 is the current running disparity, a 7-bit data word, and a signal for inserting SEP or CTRL symbols. The output of the encoder 940 is an 8-bit symbol and the next running disparity. The input to the 7b/8b decoder 942 is an 8-bit symbol. The output of the decoder 942 is a 7-bit data word, as well as a signal to indicate reception of SEP or CTRL symbols. The decoder 942 may also have an error signal to indicate that there is no symbol match.

The encoder 940 may comprise eight parallel 7b/8b encoders, which map the 56-bit block payload to the 64-bit serializer payload. The decoder 942 may comprise eight parallel 7b/8b decoders, which map the 64-bit deserializer payload to the 56-bit block payload. A TR decoder 943 in parallel with the 7b/8b decoder 942 includes voting logic configured to decode the TR_CODE fields of the control blocks, which are output through a second 7b/8b decoder 944.

A test system, including a test generator 950 positioned between the serializer 931 and the encoder 940 and a test receiver 951 positioned between the deserializer 932 and the decoder 942, may be provided whereby system operators may drive and observe test patterns through the optical and/or electrical link 900. When active, the test generator 950 may take over full control of the TX interface 901. A pseudo-random binary sequence (PRBS) may be generated using a fully programmable 32-bit LFSR. There will also be a way to push and collect pre-generated test patterns from system SRAM or DRAM directly across the TX optical interface 901, bypassing the logic in the link-layer 912 entirely. The test generator 950 and the test receiver 951 may be programmable via control and status registers (CSR). In functional mode, the test generator 950 and/or the test receiver 951 may include counters for system functions, such as corrected errors in control blocks, number of control blocks transmitted and received, data frames transmitted and received, and payload octets transmitted and received.

At initial startup the block aligner 955 may use 16-bit SYNC symbols to find the proper block alignment. The 64-bit parallel blocks coming from the SERDES receiver 932 are not necessarily properly aligned with the transmitter in the TX optical and/or electrical link interface 901. A 64-bit block aligner 955, e.g. two-stage barrel shifter, may be provided in some embodiments to enable realignment. A SYNC detector 956 is a receiver module which finds proper realignment of the block stream as they were sent by the transmitter in the TX optical and/or electrical link interface 901. The logic in the test system may control the position of the block aligner 955 in the testing mode, and logic in a SYNC detector 956 may control the position of the block aligner 955 in the functional mode.

An exemplary method of aligning the block streams comprises: during optical and/or electrical link initialization, a SYNC pattern (SYNC-A and SYNC-B) of encoded symbols, e.g. 16-bit 7b/8b patterns, are launched in the optical and/or electrical link 900, and are aligned to the least significant bit (LSB) of the deserializer 932. The SYNC patterns comprise a unique bit sequence that cannot be found in any 16-bit sliding window over any sequence of encoded 7b/8b symbols. The SYNC patterns were found via exhaustive search of the symbol space. This property will be especially important for simplex links, which give limited feedback to the transmitter about the state of the receiver. For this usage scenario, it is important that the receiver in the RX optical and/or electrical link interface 902 can quickly lock with high confidence—and stay locked—to the serializer 931.

In an exemplary embodiment, the TX interface 901 will transmit NOT_READY control blocks, which will force the RX interface 902 to transmit either NOT_READY or IDLE control blocks, each of which contain one of the two SYNC patterns. The block aligner 955 is rotated until the SYNC pattern is detected in the lower 16 bits of the 64-bit deserializer 932. To ensure proper block lock, the SYNC pattern must be detected for a fixed number of sequential blocks, configurable via CSR.

After block lock, the SYNC pattern is used to monitor synchronization. In an effort to detect single bit slips, the SYNC detector 956 may look for shifts in the SYNC pattern one position to the left and to the right, automatically adjusting the block aligner 955 as they occur. Additionally, a watchdog counter in the RX interface 902 tracks the number of cycles since the last SYNC pattern was received. The value of this watchdog is configurable via CSR. If the watchdog counter reaches zero, the controller stops the link and triggers an interrupt.

An optical and/or electrical link controller serves as the topmost part of the link-layer 912 and as the interface to the network-layer. The optical and/or electrical link controller interfaces with one TX optical and/or electrical link interface 901 from one optical and/or electrical link 900 and one RX optical and/or electrical link interface 902 from the second optical and/or electrical link 900 forming the communication link 9. The optical and/or electrical link controller comprises a TX optical and/or electrical link controller 961, which interfaces with one TX optical and/or electrical link interface 901 and an RX optical and/or electrical link controller 962, which interfaces with an RX optical and/or electrical link interface 902, forming a full-duplex photonic link channel. The link-layer protocol transfers data in 56-bit chunks called blocks. Blocks can consist of data and control messages, and each block type has a priority that can change depending on the link state. A series of data blocks composes a frame, in which an upper layer would place packets. Data blocks compose the beginning and body of a frame, and separator blocks denote the end of a frame. Control blocks can be interspersed among data blocks and frames.

After reset is released, the RX optical and/or electrical link controllers 962 on both sides of a communication link 9, i.e. in two separate chips, follow a common protocol to bootstrap themselves from an initial (INIT) state to a ready (READY) state. At startup, the TX and RX optical and/or electrical link controllers 961 and 962 on both sides of a photonic link 9 begin the initialization process by finding block lock on their RX optical interfaces 902, as described above with reference to the SYNC Detector section. During this time, both the TX and the RX optical and/or electrical link controllers 961 and 962 are in the INIT state and transmit NOT_READY blocks on their corresponding TX and RX optical interfaces 901 and 902. NOT_READY blocks communicate to the TX optical and/or electrical link controller 961 on the opposite end of an optical and/or electrical link 900 that they are not ready to receive data. Once the TX or RX optical and/or electrical link controller 961 or 962 on one side of an optical and/or electrical link 900 has finished initialization, it enters the Wait for Remote (WFR) state and must transmit IDLE blocks until its corresponding optical and/or electrical link partner has finished initialization. While in this state, the RX optical and/or electrical link controller 962 must be prepared to receive any valid data or control block at any time. Once a TX or RX optical and/or electrical link controller 961 or 962 in the WFR state receives blocks other than NOT_READY, it knows that its corresponding optical and/or electrical link partner is either in the WFR or READY state. The TX or RX optical and/or electrical link controller 961 or 962 can now enter the READY state and begin transmitting data. If the TX or RX optical and/or electrical link controllers 961 or 962 enters the FAULT state, the transmitter in the TX optical and/or electrical link interface 901 immediately begins sending NOT_READY blocks communicate to the RX optical and/or electrical link controller 962 on the opposite end of the optical and/or electrical link 900 that they are not ready to receive data.

When a RX optical and/or electrical link controller 962 loses control over its RX optical and/or electrical link interface 902 and requires reset (due to loss of block lock or some other problem), it must immediately begin transmitting NOT_READY blocks so that its link partner knows that it cannot properly receive blocks. Should a TX optical and/or electrical link controller 961 begin receiving NOT_READY blocks, it must immediately transition to the WFR state and transmit IDLE blocks. Once the TX optical and/or electrical link controller 961 begins receiving blocks other than NOT_READY, it may transition back to the READY state and resume transmitting normally.

Figure 4B:
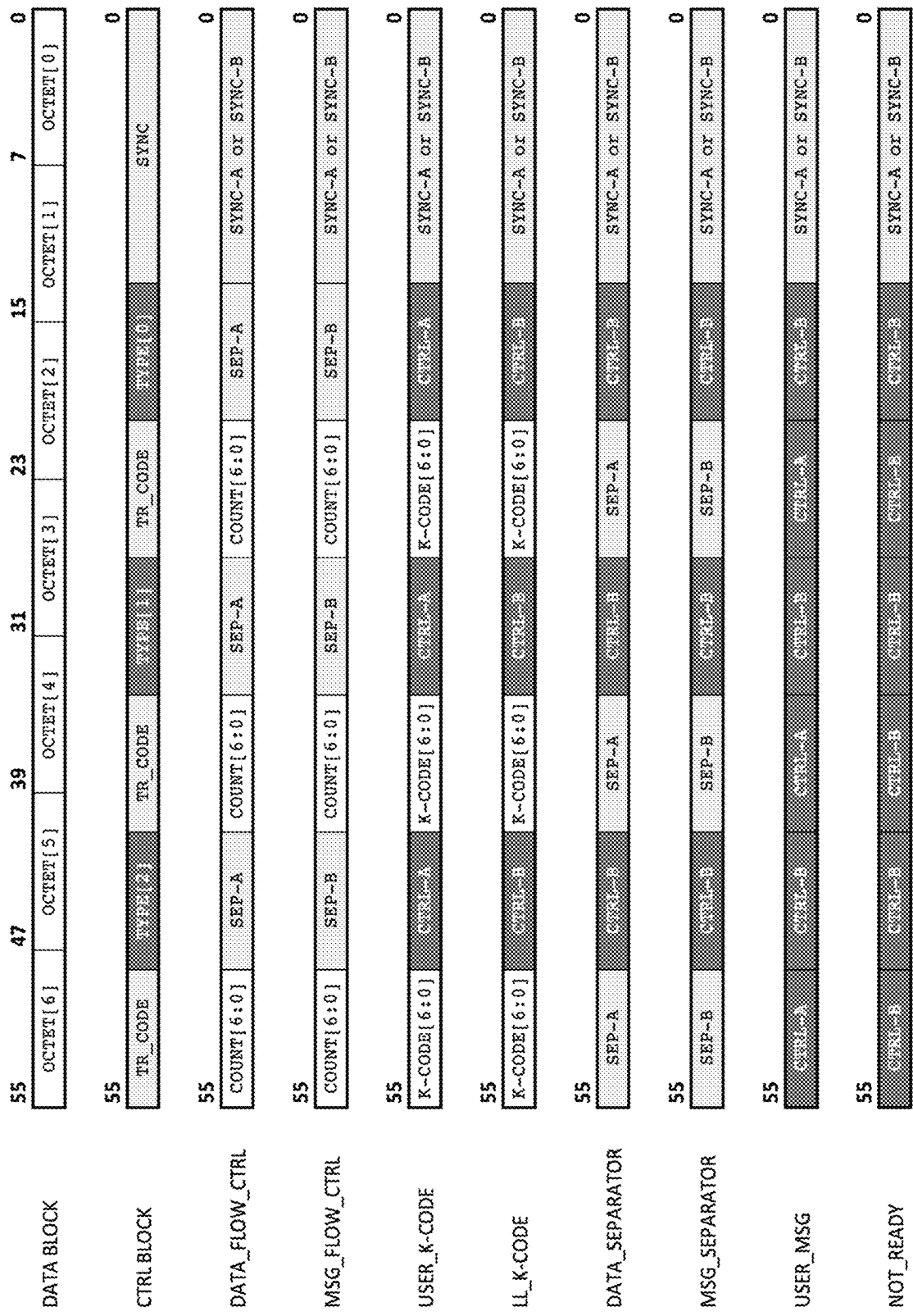
FIG. 4B is a list of 56-bit link-layer blocks.

With reference to FIG. 4B, exemplary 56-bit link-layer blocks may be either control or data blocks. Control blocks carry link-layer control messages and indicate frame boundaries. Data blocks carry frame payload. Each 8-bit data symbol of an encoded 64-bit block maps to a 7-bit uncoded data value. CTRL, SEP, and SYNC symbols do not have an unencoded 7-bit representation.

In FIG. 4B, the block diagrams show the blocks unencoded to highlight how data octets fit into an 8×7-bit=56-bit block, the control symbols are highlighted in the 7-bit fields where the encoder 940 inserts the 8-bit control code in place of normal data or control symbols for the 64-bit SERDES transmission block. Likewise, the 16-bit SYNC symbol is inserted during the control block encoding process and does not have a 14-bit unencoded representation.

Control blocks may start with one of the SYNC symbol patterns, SYNC-A or SYNC-B. The choice of either SYNC-A or SYNC-B depends on the current RD in order to maintain signal integrity in the SERDES 931/932. While the 16 bits of SYNC-A and SYNC-B have a total disparity of 0, the first 8 bits of SYNC-A and SYNC-B are biased negative and positive respectively. If RD is negative, then SYNC-B is chosen, to prevent excessive short-term negative bias. If RD is positive, then SYNC-A is chosen, to prevent excessive short-term positive bias.

The next six symbols may consist of three triple-redundant TYPE fields separated by three triple-redundant TR_CODE fields. The SYNC symbol and three TYPE fields form a 2-of-4 code, in which two of the four symbols must be valid to decode a control block. Thus, the control header is resistant to burst errors at least 8 bits long and at most 16-bits long. The TYPE fields decode the type of the control block.

TYPE Field Decode

| TYPE Value | Block Type |
| --- | --- |
| SEP-A | DATA_FLOW_C-TRL |
| SEP-B | MSG_FLOW_CTRL |
| CTRL-A | USER_K-CODE |
| CTRL-B | LL_K-CODE |

If one or two of the TYPE fields are corrupted, the type of the control block can still be determined from the remaining TYPE fields. NOT_READY, USER_MSG, DATA_SEPARATOR, and MSG_SEPARATOR blocks are special LL_K-CODES.

The TR_CODE fields are naturally resistant to burst errors, as they are both redundant and separated spatially. The TR_CODE fields are used for the numerical values of the DATA_FLOW_CTRL, MSG_FLOW_CTRL and K-CODE control blocks. Voting logic before the symbol decoder selects the majority bit value for each of the 8 bits of the three TR_CODE fields.

If a block cannot be decoded as a control block, a DATA block is assumed. DATA and DATA_SEPARATOR blocks form the data frame structure of the link layer protocol. A DATA block may be entirely composed of data symbols, arranged as a sequence of 7 octets, with no SYNC, SEP, or CTRL symbols in it. DATA_SEPARATOR block may have a control block format in which the TYPE fields are filled with CTRL-B symbols, and the TR_CODE fields are filled with SEP-A symbols. Each data frame starts with at least one DATA block, followed by zero or more DATA blocks and then terminated with a DATA_SEPARATOR block.

DATA_FLOW_CTRL and MSG_FLOW_CTRL blocks are used by the TX and RX optical and/or electrical link controllers 961 and 962 to manage the capacity of the TX and RX frame buffers 914 and 924 between the TX and RX link layers 912 and 922 and the network layer, i.e. the TX PIF 913 and the RX PIF 923, respectively.

DATA_FLOW_CTRL blocks instruct the opposing transmitter in the TX optical and/or electrical link interface 901 to enter the DATA_FLOW_CTRL state. MSG_FLOW_CTRL blocks instruct the opposing transmitter in the optical and/or electrical link interfaces 901 to enter the MSG_FLOW_CTRL state. These states push idle blocks to a higher priority than DATA and/or USER_MSG_DATA blocks for some number of block cycles, specified by the COUNT field. If a transmitter in the flow control state receives another flow control message, its counter is immediately updated with the new COUNT value. A COUNT value of 0 or an XON K-COD immediately restores the transmitter to the READY state.

The DATA_XOFF or MSG_XOFF K-CODE instructs the transmitter in the optical and/or electrical link interface 901 to immediately cease transmitting all DATA or USER_MSG blocks respectively. The transmitter will transmit IDLE K-CODES when there is nothing of higher priority to transmit.

A DATA_XON or MSG_XON K-CODE immediately releases flow control for data or message blocks. USER_K-CODES and LL_K-CODES are both 7 bits, supporting up to 128 values. USER_K-CODEs are available to the upper protocol layers for any purpose. The TX and RX link-layer controllers 961 and 962 use LL_K-CODES to manage the link and dataflow. LL_K-CODES have higher priority than USER_K-CODES.

Example Link Layer Control Codes

| TR_Code Value | Name | Description |
| --- | --- | --- |
| 0x00 | IDLE | Transmitter has nothing else to send |
| 0x02 | DATA_XOFF | Request to stop transmitting buffered data blocks |
| 0x03 | DATA_XON | Request to resume transmitting buffered data blocks |
| 0x04 | MSG_XOFF | Request to stop transmitting buffered user msg blocks |
| 0x05 | MSG_XON | Request to resume transmitting buffered user message blocks |

User messages are special frames similar to data frames, but with a higher priority. User message frames may interrupt data frames at any time, even in the middle of a data frame transmission. The internal structure of these frames is determined by the network layer, but is likely to be similar to data frames. User message frames start with a USER_MSG block, followed by one or more DATA blocks, and terminate with a MSG_SEPARATOR block. Following the separator block for a user message frame, data frame blocks return to normal priority and may resume transmission.

Control blocks have built-in error detection and correction. All control blocks are constructed to withstand single burst errors at least 8 bits long. A block that is not decoded as a control block is assumed to be a DATA block.

The SYNC symbol and TYPE fields form a 2-of-4 code, requiring only two of four symbols to be valid. A burst error of at most 8 bits can only corrupt at most two of these symbols. If the SYNC symbol is valid, then only one of the TYPE fields must also be valid. If the SYNC symbol is invalid, then two of the TYPE fields must be valid. If one or two of the TYPE fields are corrupted, the other TYPE fields are used to determine the type of the block.

The TR_CODE fields are triple redundant since they contain arbitrary number values. A TR decoder (voting circuit) 943 decodes the majority value for each bit in this field. The TR decoder 943 is positioned before the second 7b/8b decoder 944 so that it operates on the raw input data from the SERDES deserializer 932.

DATA blocks have no built-in error correction or detection facilities. Error detection and correction is the responsibility of upper layers. Single-bit errors are likely to cause corruption of an entire 7b/8b symbol, so an error detecting/correcting code suited to burst errors, such as CRC or Reed-Solomon, is recommended. Without any guarantee, the link-layer 7b/8b decoder 942 may detect some types of symbol corruption. If detected, the RX link-layer 922 will notify the network layer (RX PIF 923) of these symbol errors.

The TX buffer 914 and the RX buffer 924, which form the interface between the TX and RX link-layers 912 and 922 and the network-layers, i.e. TX PIF 913 and RX PIF 923) for both TX and RX optical interfaces 901 and 902, may each comprise three synchronous or asynchronous buffers. The three buffers for each TX and RX optical interface 901 and 902 may comprise a data frames buffer 917 or 927, a user message frames buffer 918 or 928, and user K-code buffer 919 or 929, which may be disposed between the link-layers 912 and 923 and the network layer, i.e. TX PIF 913 and RX PIF 924, respectively. The user message buffers 918 and 928 and the data frame buffers 917 and 927 may store 7-octet payload blocks with additional control bits prepended that denote additional information, the start of a frame/packet, and the end of a frame/packet.

The TX link-layer controller 961 may pull one of the 7-octet blocks from the TX buffer 917 when it is ready to transmit data, and the RX link-layer controller 962 will push one of the 7-octet blocks to the RX buffer 927 when it receives data. The RX link-layer controller 962 will manage the capacity of the RX buffer using the flow control mechanism described.

Figure 5:
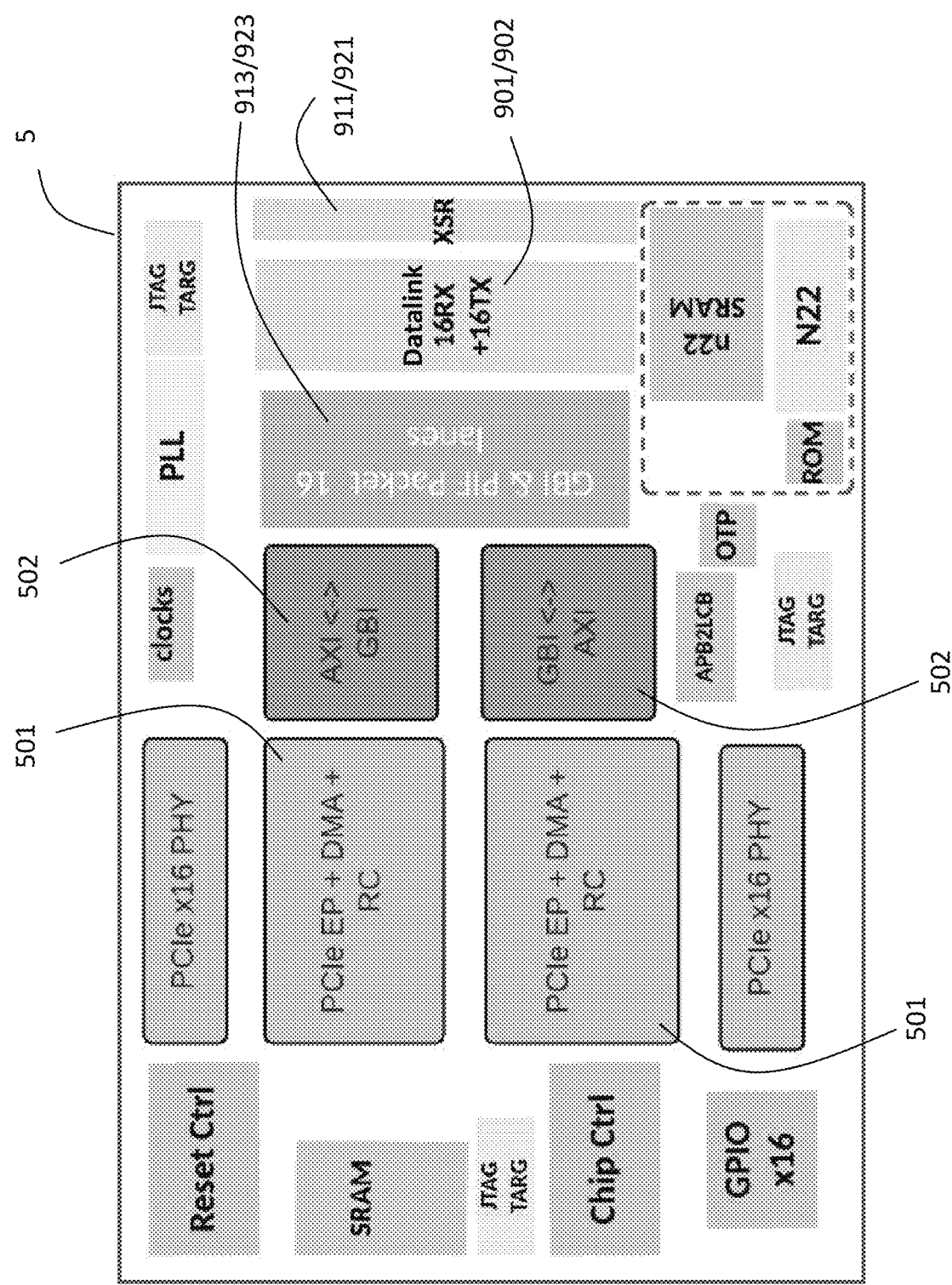
FIG. 5 is a schematic diagram of an exemplary bridge device in accordance with the present disclosure.

With reference to FIG. 5, the bridge device 5 are a bridge between a host computer motherboard and the optical computer system 1, in particular between a peripheral component interconnect (PCI), e.g. PCI express or PCIe-Gen5, and the TX and RX optical and/or electrical link interfaces 901 and 902, which provides a path for programs running on the host computer system, e.g. Linux servers, to copy massive amounts of data to the memory modules 21 or any other destination on the optical computer system 1 and then run their programs on processors in the computational devices 3. Accordingly, the bridge device 5 enables an application to read or write every single byte in the memory rack unit 11 or cluster of memory rack units $11_1$ to $11_n$, including any byte in the peripheral register space of any endpoint in the computation devices 3. In some embodiments, the bridge device 5 guarantees 1.0 Tb of aggregate (bidirectional) throughput over the optical and/or electrical links 900 via the plurality of optical and/or electrical link interfaces 901 and 902 thereon, which is typically limited by the bandwidth of the PCI. To achieve this bit rate, the bridge device 5 includes TX and RX optical and/or electrical link interfaces 901 and 902, each with a serializer 931 of a TX PHY 911 and a deserializer 932 of a RX PHY 921. In mission mode, the bridge device 5 connects to a tier 2 switch device 4 or potentially a higher order T>1 switch device 4 in some configurations. Outside of mission mode, the bridge device 5 can connect directly to the aggregation devices 2.

Each of the bridge devices 5 may connect to one tier, e.g. 2 or 3, (T>1) switch device 4 or each memory rack unit 11 can be configured with a plurality, e.g. four or more, bridge device 5 connected to one tier, e.g. 2 or 3, (T>1) switch device 4. The limit is on the host computer server, not on the optical computer system 1. Likewise, a cluster of memory rack units $11_1$ to $11_n$, can be configured with at least 8 or 16 bridge devices 5. The limitation on the host computer server may be one of PCI sockets in the motherboard. For example, four bridge devices 5 on four PCIe cards using four ×16 slots with 1×PCIe Gen5.

One exemplary configuration includes: 2× PCIe Gen5, 1× XSR NRZ or PAM-4.

PCIe bandwidth for one bridge device 5:
1× Gen5: 16 lanes*2 direction*32 GT/s=1024 Gb/s
2× Gen5: 32 lanes*2 direction*32 GT/s=2048 Gb/s Optical and/or electrical link bandwidth for one bridge device 5:
16 lanes*2 direction*56 Gb/s (NRZ)*⅞=1568 Gb/s on communication, e.g. photonic, link 9
16 lanes*2 directions*112 Gb/s (PAM4 RAW)*⅞=3136 Gb/s on communication, e.g. photonic, link 9
16 lanes*2 directions*90 Gb/s (PAM4 Realized Peak) *⅞=2520 Gb/s.

The bandwidth for one bridge device 5 is limited by the slowest path, i.e. PCI or photonic link 9, which is 512 Gb/s each way for an aggregate of 1024 Gb/s. As such, the limit for a four bridge devices 5 is system is 4*16 PCI lanes*32 GT/s*2=4096 Gb/s of aggregate PCI bandwidth. Because of the relatively low bandwidth of PCIe GEN 5 interfaces, the optical and/or electrical link connections between one bridge device 5 and one Tier 2 switch device 2 can be run at speeds down to PAM-4 at 28-G baud without impacting performance. Even NRZ at 28-GBaud is nearly as performant.

The bridge device 5 is a bridge device that in some embodiments connects a PCIe fabric on one side with the optical and/or electrical link fabric on the other. A bridge device 5 may include a PCI endpoint controller 501, e.g. a PCIe endpoint controller, a plurality, e.g. 16, of TX interface 901, each including a TX PIF 913 and a TX PHY 911, and a plurality, e.g. 16, of RX interface 901, each including an RX PIF 923 and an RX PHY 921, plus some logic to bridge the PCI to optical and/or electrical link connection, e.g. to bridge the PCIe controller's AXI buses and the TX and RX PIFs 911 and 913.

The bridge device 5 includes hardware necessary to support the bidirectional flow of commands and responses between the host system's memory space and addresses in optical computer system 1. The command/response flow not only enables access to the memory modules 21 (DRAM) in the aggregation devices 2, but also enables access from CPUs to the host, interrupts to the host, and internal chip communications. Control and status registers support performance measurement, securing of the platform, and system reliability.

The bridge device 5 is configured to transfer data between the host computer's physical address space and the physical address space of the optical computer system 1. The bridge device 5 does so by being configured for converting electrical signals in the form of packets, e.g. transaction layer packets (TLP), from the host computer into optical signals in the form of packets, e.g. MEMCPY or DMA protocol packets, compatible with the optical computer system 1 and vice versa. The TLP packet format is well documented in the PCIe world, for example: the TLP comprises a header, an optional data payload, and an optional TLP digest.

The packet conversion is implemented in a combination of a TX and RX PIF 913/923 and a corresponding GBI (Generic bus interface) block 502. The GBI block 502 is a module attached to the internal port of the TX and RF PIF 913/923 that converts between PIF transactions and the system on chip (SoC) specific fabric protocol, e.g. TLP packets to MEMCPY packets. The GBI block 502 may include an AXI initiator on an AXI bus connecting it to the TX and RX PIF 913/923. The MEMCPY packets may be generated as initial read requests or write requests. The latter also contains a write data payload. The MEMCPY packets, may be PIF (packet interface) packets that flow over the TX and RX optical and/or electrical link interfaces 901 and 902.

Figure 6A:
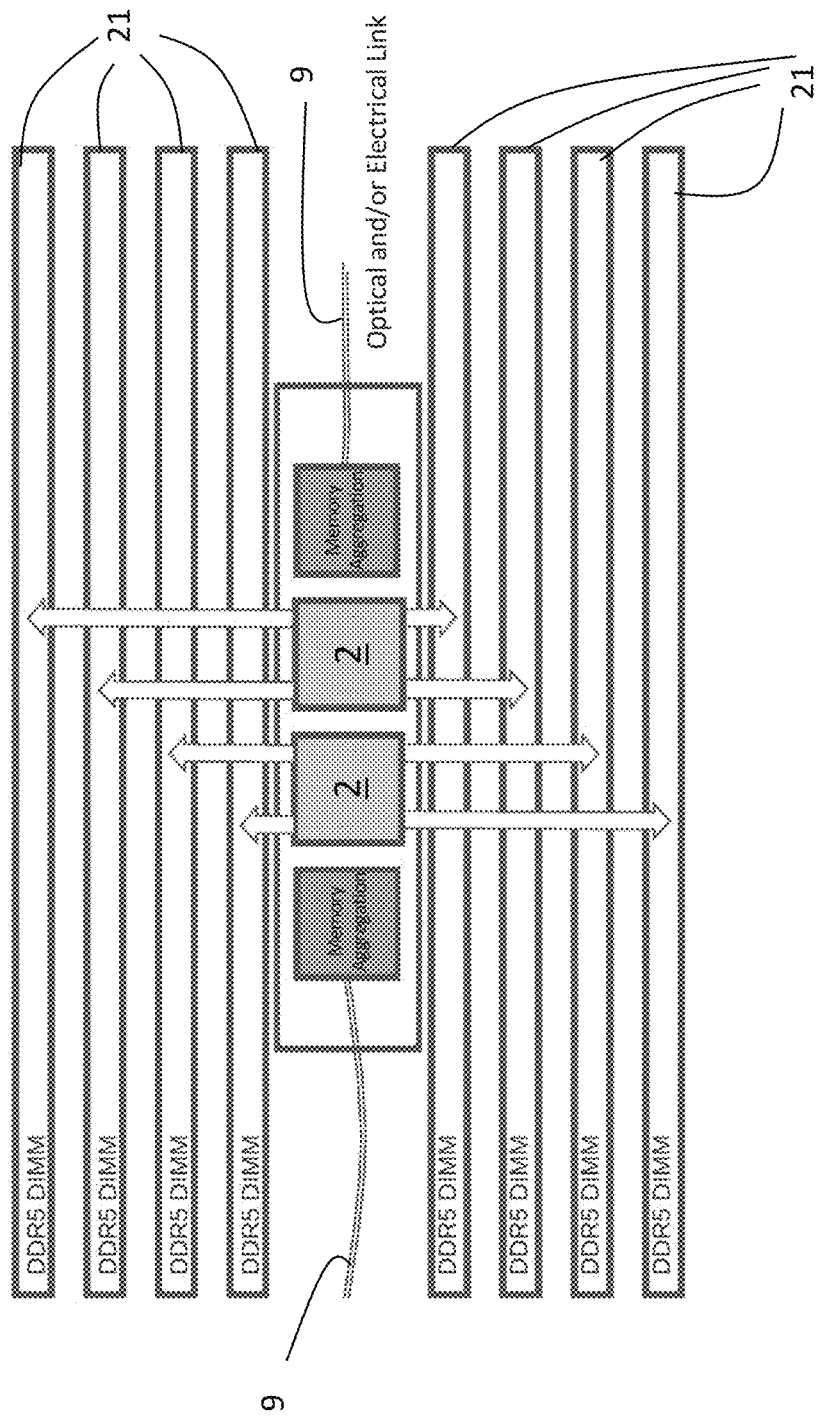
FIG. 6A is a schematic diagram of an exemplary memory aggregation device in accordance with the present disclosure.

FIG. 6A illustrates an exemplary memory aggregation device 2 in a memory rack unit 11. The memory aggregation device 2 is the intermediary between communication links 9 and a plurality of memory modules 21, e.g. 2-8 DDR5 DIMMs, preferably 4-8 memory modules 21 per memory aggregation device 2. The memory modules 21 may contain up to 64 GBytes (or more) of memory and up to 256 GBytes (or more) of DRAM memory, only limited by the current technology generation of DRAM DIMMs. With 256 DIMMs in the computer system 1, then a single memory rack unit 11 may contain over 100 GB, preferably up to 2 TBytes to 64 TBytes of DDR5 DRAM, and a single cluster comprising ten memory rack units $11_1$ to $11_{10}$ may contain 20 TBytes to 640 TBytes of DDR5 DRAM. Just two clusters or ten memory rack units $11_1$ to $11_{10}$ can contain more than 1 PByte of DDR5 DRAM and a full 240 memory rack unit system can contain more than 61 PBytes of DDR5 DRAM. This is a phenomenal amount of working storage for systems, such as the world's largest and fastest AI supercomputer. This vast DRAM complex is comparable to the fastest HBM DRAM configurations, without the severe capacity limitations incurred by HBM.

Figure 6B:
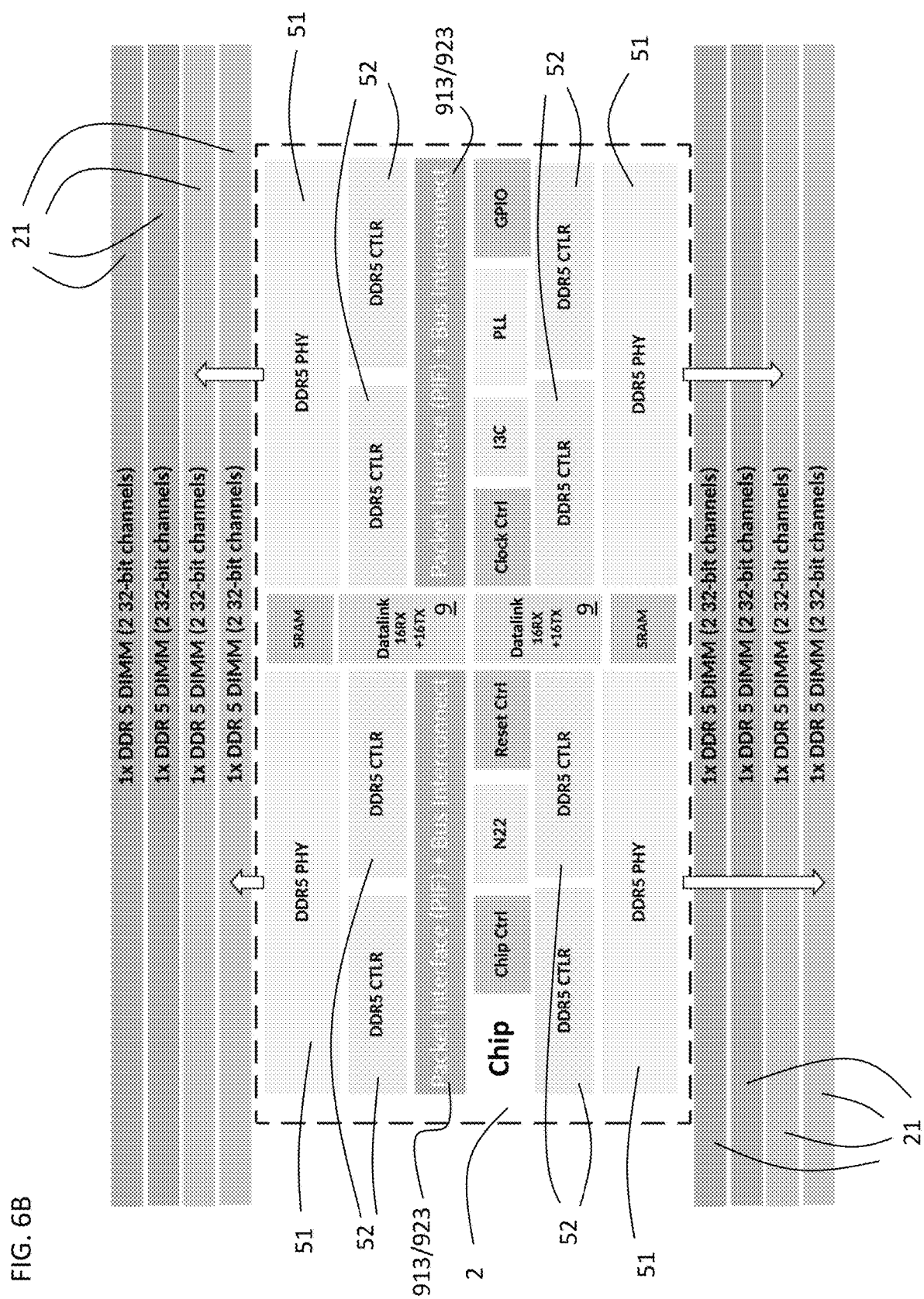
FIG. 6B is a schematic diagram of an exemplary memory aggregation device in accordance with the present disclosure.

With reference to FIG. 6B, in an exemplary arrangement, each memory aggregation device 2, connects to the plurality of memory modules 21 via memory module physical layer (PHY) internet protocol (IP) connector 51, one for each memory module 21, e.g. DIMM. The PHY connector 51 may be an electronic circuit, e.g. an integrated circuit, required to implement physical layer functions of the OSI model in a memory controller 52. The PHY connectors 51 connects the memory modules 21 to the TX and RX optical and/or electrical link interfaces 901 and 902. In addition, there may be two memory controllers 52, e.g. DRAM controllers, for each memory module 21 for a total of 8 memory (DRAM) controllers 52 on each memory aggregation device 2. Each (DDR5 DRAM DIMM) memory module 21 may contain two channels, both of which may be connected to the same DRAM PHY IP connector 51. Each memory controller 52 may be connected to exactly one channel, whereby the memory module 21 behind one channel may be completely independent from the memory module 21 behind the other channel. Thus, both memory controllers 52 can cycle their part of the memory on the memory module 21 in parallel with each other.

Figure 6C:
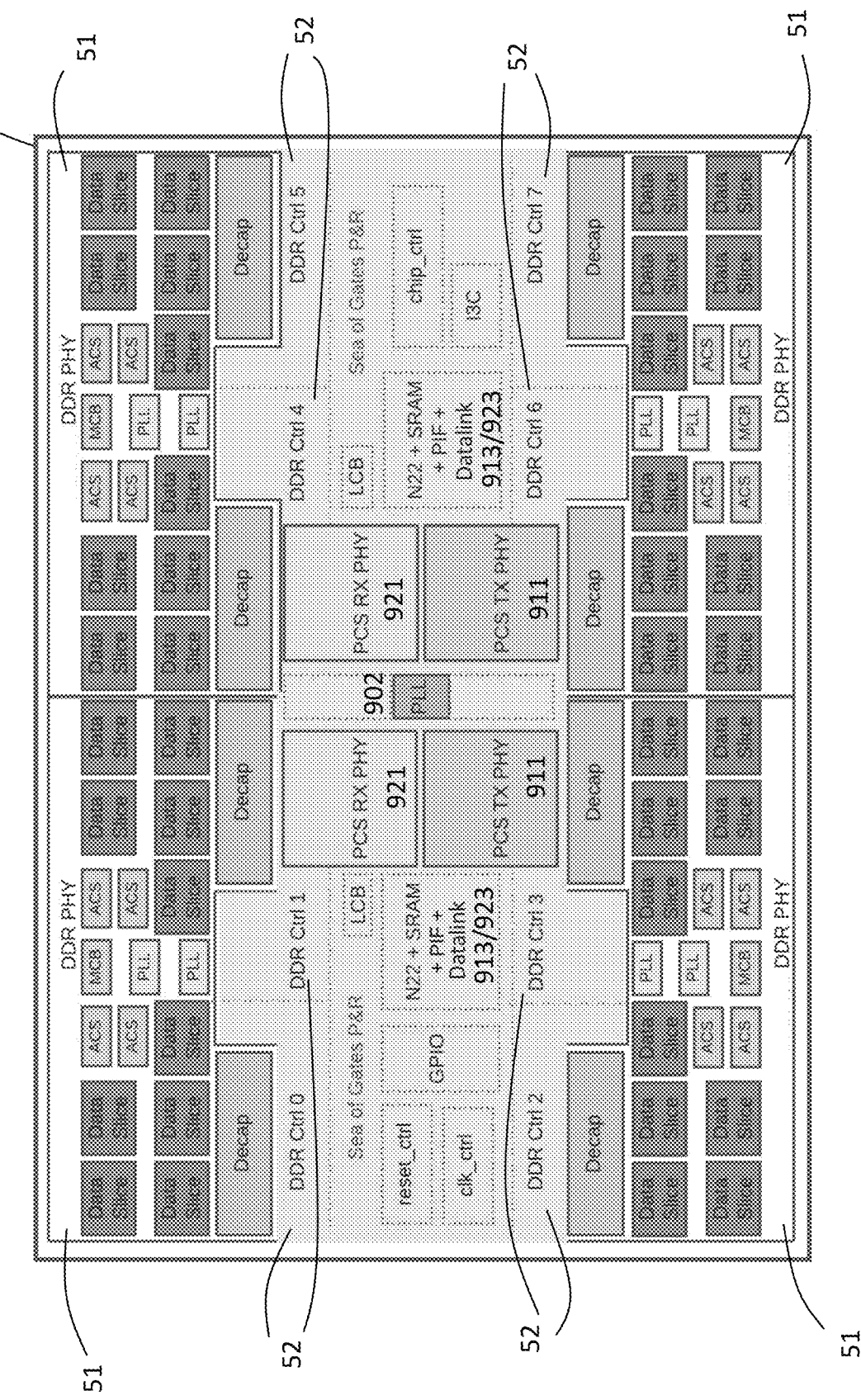
FIG. 6C is a schematic diagram of an exemplary memory aggregation device in accordance with the present disclosure.

With reference to FIG. 6C, in addition to the four PHY connectors 51 on each memory aggregation device 2, there may be two pairs of TX and RX PHY's 911 and 921, respectively, each including the corresponding SERDES component, e.g. serializer 931 or deserializer 932, e.g. XSR SERDES block. Each SERDES may support a plurality, e.g. up to 16 or more, transmitter (TX) and a plurality, e.g. up to 16 or more, receiver (RX) optical and/or electrical link interfaces 901 and 902. Each of the pairs of TX and RX optical and/or electrical link interfaces 901 and 902 may operate completely independently from the others. They may or may not be bonded together in any way. Each one conveys a memory copy (MEMCPY) packet that is described in more detail below. Thus at least 16 or more substantially simultaneous read requests can be issued to each memory aggregation device 2 at once over the plurality, e.g. 16, RX lanes of the pairs of optical and/or electrical links 900. Meanwhile the read data packets serving the plurality, e.g. up to 16 or more, substantially simultaneous read requests can be transmitted at once over the plurality, e.g. up to 16 or more, TX lanes of the pairs of optical and/or electrical links 900. Accordingly, for example up to 4 (or more) Kbyte read data packets can be emitted at once from each TX lane on each memory aggregation device 2 or 16×4 Kbyte packets of read data can be sent in parallel, which means that traffic from all eight memory controllers 52 can flood the optical and/or electrical links 900 in parallel.

FIG. 6C illustrates an exemplary memory aggregation device 2 in which there may actually be two TX PHY 911 and two RX PHY 921, i.e. two SERDES 931/921, on each memory aggregation device 2, two transmit (TX) serializers 931 and two receiver (RX) deserializers 932. Thus, each memory aggregation device 2 may be actually serviced by up to 32 TX optical and/or electrical link interfaces 901 and up to 32 RX optical and/or electrical link interfaces 902. There are a number of other blocks shown in this floor plan, but we will ignore them for now and focus only upon the memory interfaces and the optical and/or electrical link interfaces 901 and 902. Accordingly, each memory aggregation device 2 offers extremely high-capacity support for the memory modules 21 in an extremely fast and highly parallel fashion. It does this while taking extreme advantage of the interleaving possibilities inherent in the computer system 1.

In the example above, the four memory modules 21, e.g. DDR5 banks, connected to the memory aggregation device 2 are interleaved on 4 KB boundaries. A controller bit in an address map above the 4 KB boundary picks one of the two memory controllers 52 associated with the memory module 21, e.g. DDR5 DIMM memory bank. Each memory controller 52 in the memory aggregation device 2 may have up to eight (or more) AXI interface ports, each of which is independent of the others. Half, e.g. four, of the ports may be connected to an AXI interface of one TX and RX PIFs 913 and 923, and half, e.g. four, may be connected to the AXI interface of a separate TX and RX PIFs 913 and 923. The AXI interfaces between the two TX and RX PIFs 913 and 923 are not connected in any way. The TX and RX PIFs 913 and 923 may only have the capability to execute AXI transactions to only the two memory controllers 52 connected to it, thereby greatly simplifying the interconnect.

Overall, the TX and RX PIFs 913 and 923 within the memory aggregation devices 2 may perform one or more of the following services:
1. Receiving, validating, and processing endpoint MEMCPY or DMA packets from the optical and/or electrical link interface 901 or 902. Supported commands within the MEMCPY or DMA packets include write operations (WRITE and WRITE WITH ACK) and complete read request operations.
2. Generating MEMCPY or DMA packets for read data and WRITE ACKs and transmitting these back through the optical and/or electrical link interface 901 and 902.
3. Provide routing of the optical and/or electrical link transactions between optical interfaces 901 and 902 as needed for support of bypass functions.
4. Providing debug and POST functions through the generation of MEMCPY or DMA packets and associated commands.

Each TX PIF 913 and RX PIF 923 may contain a device-specific interface module called the GBI (Generic Bus Interface) which is used to connect to the internal fabric of each device, e.g. device 2, 3, 4 and 5. The GBI module is customized per device to match the internal protocol. For the memory aggregation devices 2, the memory controllers 52 may be the only target devices connected to the TX PIF 913 and the RX PIF 923. In some embodiments the memory controllers 52 may implement an AXI4 bus protocol, so the TX PIF 913 and the RX PIF 923 use a GBI module called PIF_AXI_GBI. The PIF_AXI_GBI module is the device initiator on the AXI bus and supports read and write operations as needed to complete the incoming commands. The version of the PIF_AXI_GBI using the memory aggregation devices 2 supports two separate target devices without the need for additional interconnect logic.

The MEMCPY transaction system address sent within the bulk data packets is modified when used for the AXI address to the memory controller 52. The system address contains a number of bit fields selecting the final board, system, and route for the packet. This information may be removed from the final address presented to the memory controller 52. The current addressing of 40 bits allows each memory controller 52 to support up to 1 TByte of locally connected memory.

Figure 7:
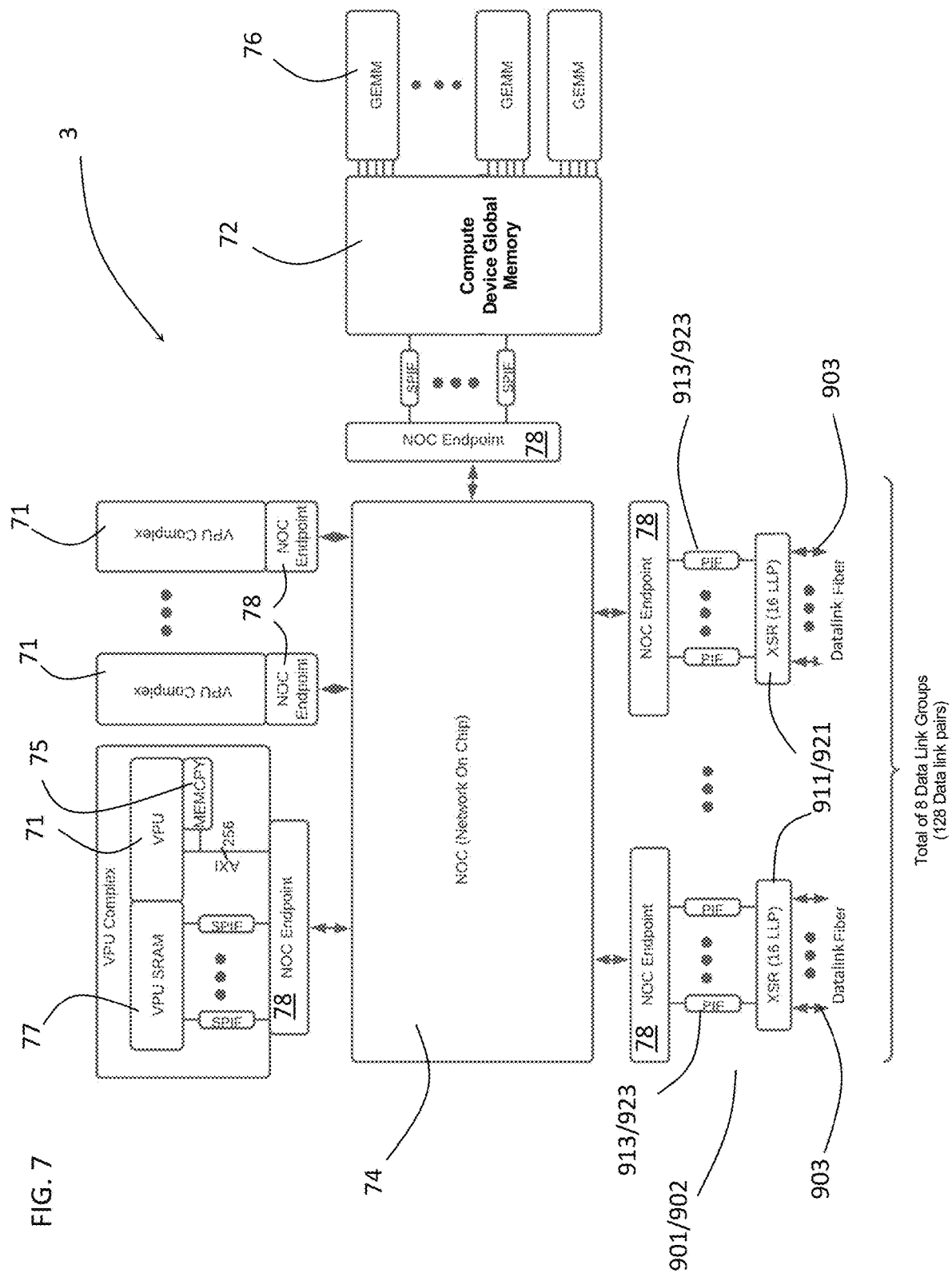
FIG. 7 is a schematic diagram of an exemplary computational device in accordance with the present disclosure.

FIG. 7 illustrates the top-level block diagram of the computational device 3, in which there may be four major areas: one or more vision processing units 71, a global memory (GM) 72, TX and RX communication link interfaces 901 and 902, and a network on chip (NOC) 74. A general matrix multiplication (GEMM) matrix 76 may be coupled to the GM 72. Each of the other areas may be connected to the NOC 74 via NOC endpoints 78.

There may be a plurality, e.g. up to 128 or more, of pairs of communication links 900 connecting each computational device 3 to the rest of the computer system 1 via the TX and RX communication link interfaces 901 and 902. For example: sixteen communication links 9, i.e. pairs of optical and/or electrical links 900, may be connected from each of the eight switch devices 4. Each of the, e.g. 128, pairs of optical and/or electrical links 900 may be completely independent from the other pairs of optical and/or electrical links 900. Accordingly, a plurality, e.g. 128, of memory read requests or write transactions to the memory modules 21 via the memory aggregation devices 2 and the switch devices 4 may be launched in parallel from a single computational device 3, whereby when the total of the number of computational devices 3, e.g. 8, in a memory rack unit 11 multiplied by the number of communication links 9, e.g. pairs of optical and/or electrical links 900, e.g. 128, results in a large number, e.g. up to 1024 or more, simultaneous memory request transactions can be emitted from the computational device 3 for each memory rack unit 11. For example, the 64 memory aggregation devices 2 in a memory rack unit 11 can have 16 pairs of optical and/or electrical links 900 and can receive up to 1024 memory request transactions at the same time. Each computational device 3 may include a memory copy, e.g. MEMCPY, engine 75 as part of each vector processing unit (VPU) 71, described below, which can flood all, e.g. 128, of the communication links 9, e.g. the TX optical and/or electrical links 900, on a computational device 3 with read requests or write transactions for up 4K (or more) data payloads each. At 90 Gbps effective bandwidth for a single communication link 9 this amounts to more than 1.4 Tbps per computational device 3 per direction or more than 115 Tbps for the computational devices 3 in a single memory rack unit 11. With all 240 memory rack units 11 operating at peak bandwidth, the bandwidths on the TX lanes can be 2.8 Pbps and the same in the RX direction simultaneously. This is for traffic that stays strictly within the memory rack unit 11. How all these computational device 3 transactions can leave a memory rack unit 11 and move data freely between memory rack units 11 is described below.

The memory copy engine 75 and the plurality of communication links 9, e.g. pairs of optical or electrical links 900, up to 128 (or more), can be used to move data back and forth between the computational device 3 and the remote memory, e.g. memory modules 21, e.g. DRAM DIMMs, simultaneously in parallel. The communication links 900 may also be able to freely support computational device 3 to computational device 3 transfers. Each computational device 3 includes local memory, e.g. the large, shared global memory (GM) 72. The memory copy engine 75 can move data between the GMs 72 on two or more computational devices 3. This is particularly useful when sharing intermediate results from calculations from the VPU 71 or the GEMM matrix 76, e.g. ALL REDUCE. In addition, the source or destination of the memory copy engine 75 can target any of the remote memory modules 21 or local memory, e.g. SRAMs 77, that are tightly coupled to the VPUs 71. Thus the memory copy engine 75 can orchestrate data movement over the pairs of communication links 900 from any memory in any of the four device types 2-5 to anywhere in the computer system 1. To that end, all physical memory addresses used for work in the memory copy engine 75 requests are a full 64-bits. These addresses may be divided between remote memory (DRAM) addresses and all other endpoints including the local memory, e.g. the GMs 72 and the VPU SRAMs 77.

The computer system 1 is optimized for fast, large-block transfers between external memory modules 21 (DDR) connected to the memory aggregation devices 2 and the compute subsystem contained within the computational devices 3. The block sizes used within the system are generally multiple megabytes. The memory copy engine 75 performs the job of breaking the large data transfers into smaller, e.g. MEMCPY or DMA, packet-sized operations, e.g. as many MEMCPY transactions as there are communication links 9, e.g. communication link interfaces 901 or 902, on the computational device 3 which can be put into operation nearly simultaneously, that are then dispatched over multiple optical and/or electrical link interfaces 901 or 902 and transferred in parallel. A memory copy engine on the bridge device 5 performs a similar function to the memory copy engine 75 on the computational device 3.

The MEMCPY or DMA is actually implemented in a combination of the TX PIF 913 or RX PIF 923 and its corresponding "personality defining" GBI (Generic bus interface) block. The GBI block is a module attached to the internal port of a PIF instance that converts PIF transactions into the SoC-specific fabric protocol. In the case of memory aggregation devices 2, this personality may be that of an AXI initiator on the AXI bus connecting it to the (DDR5 DRAM) controller 52. In the case of the computational devices 3 or the bridge devices 5, the MEMCPY packets are generated as initial read requests or write requests. The latter also contains a write data payload. The MEMCPY packets, may be PIF (packet interface) packets that flow over the optical and/or electrical link interfaces 901 or 902. It is easier to conceptualize the MEMCPY packets at the higher level of a MEMCPY or DMA transaction than at the subparts, such as PIF protocol decomposition and composition or its associated optical and/or electrical link interface flow mechanisms. This use of the term "DMA" to characterize what happens in a PIF and GBI interface within a chip helps with the understanding of the operations in the PIF/GBI. This usage of the term DMA is different and distinct from the term "DMA" as used in discussions involving the higher order functions of a PCIe DMA. The DMA data transfers are referred to as bulk data transfers, but in some embodiments, the maximum size of any of the DMA or bulk data transfers may be 4 KB.

All of the MEMCPY packets in the computer system 1 may work in push mode. In the case of a read operation, a read request packet is first "pushed" to the target optical and/or electrical link interface, e.g. the RX optical and/or electrical link interface 902 of the memory aggregation device 2. The RX optical and/or electrical link interface 902 performs the read and then creates a "push" transaction containing the read data in the form of MEMCPY packets. The packet header contains return address information as well as transaction tagging via a JOIN field.

The MEMCPY or DMA packet can also be routed intact through any RX optical and/or electrical link interface 921 such on the switch device 4. DMA or MEMCPY packet routing through any RX optical and/or electrical link interface 921 is needed when the connected device is not the target endpoint for the MEMCPY or DMA transaction and the transaction must pass through the device to reach the target endpoint. Such is the case for a switch device 4. The RX PIF 923 uses the passthrough path or mode for these operations and mixes the passthrough MEMCPY or DMA packets with the other MEMCPY or DMA packets through the same RX optical and/or electrical link interface 902. Each MEMCPY or DMA packet contains a return address that is used by the end point, such as a memory aggregation device 2, to select a link for returning read data packets or write acknowledgment packets. Similarly, the return address is used by a computational device 3 and a bridge device 5 to forward read data or write acknowledgement packets back to a specific link.

The MEMCPY or DMA packet may be processed within a device, e.g. the memory aggregation device 2, the computational device 3, the switch device 4 or the bridge device 5, in one of three ways:

The MEMCPY or DMA packets can be processed by the endpoint device, such as the memory aggregation device 2. Read and write transactions that arrive on the RX optical and/or electrical link interfaces 921 of the memory aggregation device 2 will be directed by the memory aggregation device 2 to the memory modules 21, e.g. DDR5 DRAM, ending up either as a write transaction to the memory module 21 or processed as a read request. Then the memory aggregation device 2 is configured to generate a matching read data MEMCPY or DMA packet and sends it back to the originator.

The MEMCPY or DMA packet can be routed through a device via a passthrough path, such as when the MEMCPY or DMA packet is sent through one of the switch device 4. The switch device 4 will transfer the MEMCPY or DMA packet from one of the RX communication link interfaces 921 to one of the TX optical and/or electrical link interfaces. No processing will be done on or by the MEMCPY or DMA packet itself.

The MEMCPY or DMA packet can be created as a result of processing the higher level memory copy transaction. A memory copy, e.g. MEMCPY, command is decomposed into one or more individual MEMCPY or DMA packets and dispatched into the optical computer system 1. The results are then collected to finish the memory copy, e.g. MEMCPY, operation. Normally, when one of the MEMCPY or DMA operations is created from a programmer's memory copy request, it is the computational device 3 that creates the operations. The bridge devices 5 may not contain a memory copy engine 75 itself. Instead, the bridge devices 5 may use a standard PCIe-style MEMCPY or DMA controller on the PCIe side to generate and distribute packets across all of the channels of the optical and/or electrical links 900. The bridge devices 5 may use the JOIN field for credit posting back to the host.

Every single transaction on any communication link 900 may look as if a burst-oriented parallel memory request bus was extruded through one communication link 900. One packet on one communication link 900 is an independent transaction from all other transactions on all other communication links 900 connected to a device, even if they are directed to the same memory module 21, i.e. DRAM bank, on one of the memory aggregation devices 2.

For the switch devices 4 described herein, the switch fabric is simply a pathway for MEMCPY or DMA packets coming from one endpoint, for example one of the memory aggregation devices 2, to another endpoint, for example, bridge devices 5, e.g. PCIe bridge chip or one or the computational devices 3, i.e. they pass through unmodified.

The general matrix multiplication (GEMM) engine 76 in the computational device 3 may include a plurality, e.g. 128 by 128, of systolic arrays that have a large enough capacity to satisfy the plurality, e.g. 128, of communication links 9, e.g. pairs of optical and/or electrical links 900. The memory copy engines 75 and the pairs of communication links 900 are kept very busy moving input tensors from the memory modules 21 or from other computational devices 3 into the GM 72 for further processing by the GEMM engine 76. The GM 72 also serves as a landing buffer for embedding table lookups, which are also accelerated by the memory copy engine 75, as further described hereinafter.

Each computational device 3 may include the sophisticated Network On Chip (NOC) 74. The NOC 74 is an extension of the communication links 9, e.g. the optical and/or electrical links 900, onto and within the computational device 3. The same MEMCPY or DMA packets that flow on each optical and/or electrical link 900 may also flow, unmodified, on the NOC 74 to their final destination on the computational device 3 or from their original source on the computational device 3.

Figure 8:
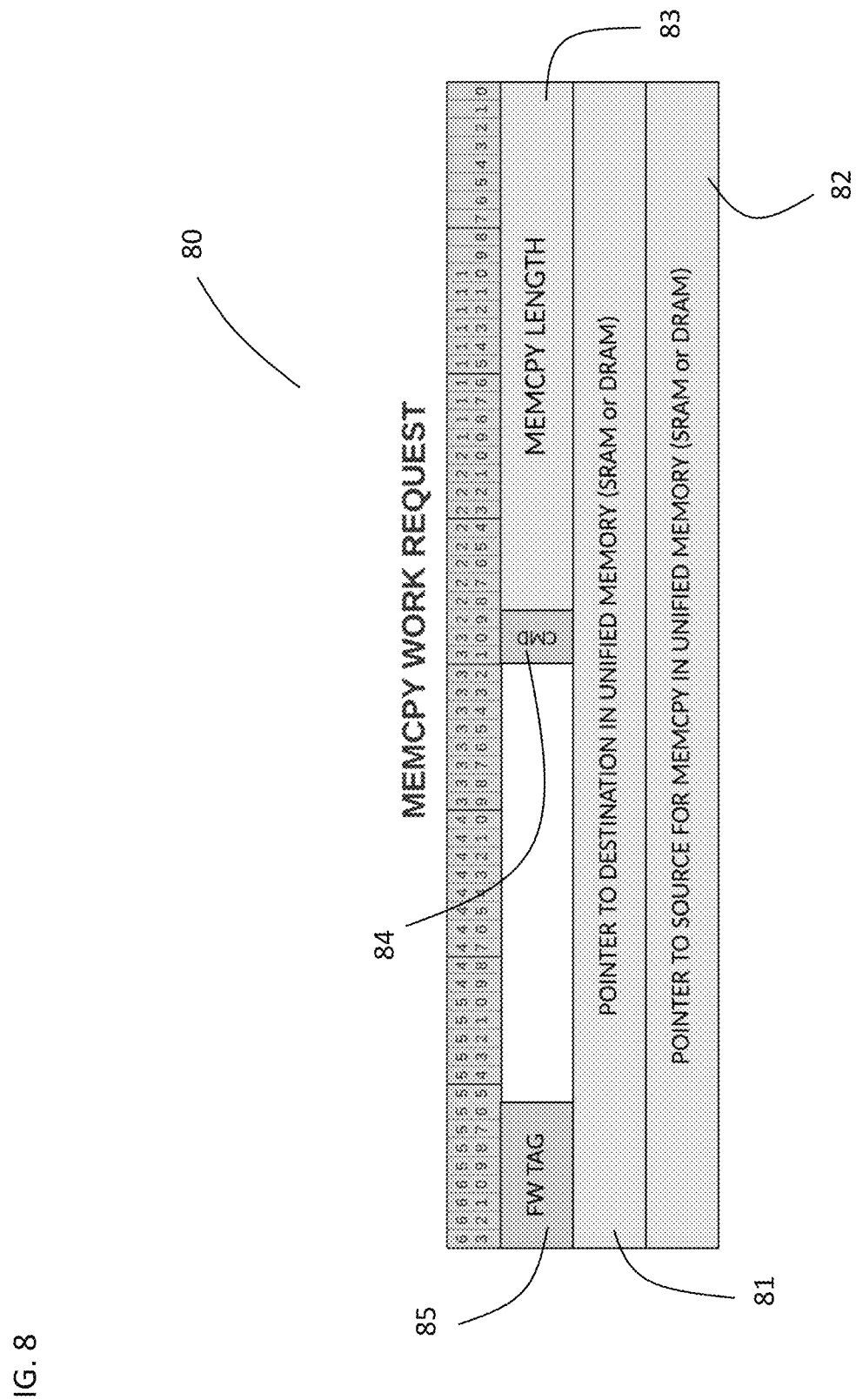
FIG. 8 is a schematic diagram of an exemplary MEMCPY work request packet in accordance with the present disclosure.

Firmware may generate work requests by writing a structure in the VPU SRAM 77. An exemplary basic structure for a work request 80 is shown in FIG. 8. The memory copy engine 75 can orchestrate both simple data movement operations as well as accelerated embedding table lookups. For simple data movement requests, the work request 80 may contain one or more of the following fields: a destination pointer 81 to a, e.g. 64-bit, physical destination address; a source pointer 82 to a, e.g. 64-bit, physical source address; a length field 83; a command field 84 (MEMCPY vs embedding lookups); and a firmware tag field 85 to facilitate interrupt processing.

When a work request 80 is handed off to the memory copy engine 75 in the VPU 71, the memory copy engine 75 may break it up into a plurality of MEMCPY or DMA request packets, e.g. 4K Bytes each, on a plurality, e.g. up to 128, of TX lanes, and then sends out read or write requests to move the requisite data. Firmware can request a work request 80 to move, e.g. 4 MBytes of data, from the memory modules 21 to the GM 72. To process this, the memory copy engine 75 may construct a plurality, e.g. 512 to 2048×2 KByte to 5 Kbyte, preferably 1024×4 KByte, MEMCPY or DMA request packets and drops them onto the NOC 74. The MEMCPY or DMA request packets are transmitted to the TX optical and/or electrical link interfaces 913 and are launched onto the optical and/or electrical links 900. To process the 1024×4 KByte transfers, the plurality of, e.g. 128, pairs of optical and/or electrical links 900 may each handle the plurality, e.g. up to 8 (or more) of the MEMCPY or DMA request packets and the corresponding plurality of, e.g. up to 8 (or more), read data packets coming back from the memory aggregation devices 2 and associated memory modules 21. Because of the switch devices 4 and the, e.g. 512-way, interleaving on all of the memory controllers 52 on the memory aggregation chips 2, the MEMCPY or DMA request packets, e.g. 512, will be sent to a different interleave in the (DRAM) memory modules 21. Then the second, e.g. 512, MEMCPY or DMA requests packets will be sent into the multi-way, e.g. 512, interleave. This means that as fast as the memory copy engine 75 can launch packets they will launch read requests in the, e.g. 64, memory aggregation devices 2. The latency of the optical and/or electrical links 900 is incredibly small, but when the data passes through the SERDES 931/932 and into a digital clock domain then unfortunate synchronizing clock delays happen which slow down the latency slightly. In addition, Forward Error Correction (FEC) on the optical and/or electrical links 900 and uncorrectable error management for the optical and/or electrical links 900 slow down the latency a bit more. Then there is the latency associated with the access to the memory modules 21 itself, i.e. the optical and/or electrical links 900 are not latency free in actual use. The optical computer system 1 may be designed to work around these latency issues, as described below.

As described previously, there can be up to ten or even more than ten memory rack units 11, in a cluster, and even up to 240 or more than 240 memory rack units 11 in the computer system 1. To facilitate this, all physical addresses, e.g. 32-128 bit, preferably 64-bit, may contain an identification, e.g. (BOX_SEL or BOX ID) field 91. The identification field 91 may uniquely identify a memory rack unit 11 or a cluster of memory rack units 11. Thus, any byte of DRAM anywhere in the cluster of memory rack units 11 or any byte of computational device VPU SRAM 77 anywhere in cluster of rack units 11 or the SRAM on hundreds of the bridge devices 5 can be addressed as either a source or a destination for a memory copy operation. This includes the peripheral registers in the VPUs 71 or the bridge devices 5. The physical address in the optical computer system 1 may be truly a unified memory address. The compiler generated executables or any other program running in a VPU 71 or through a bridge device 5 all see exactly the same physical address.

Figure 9:
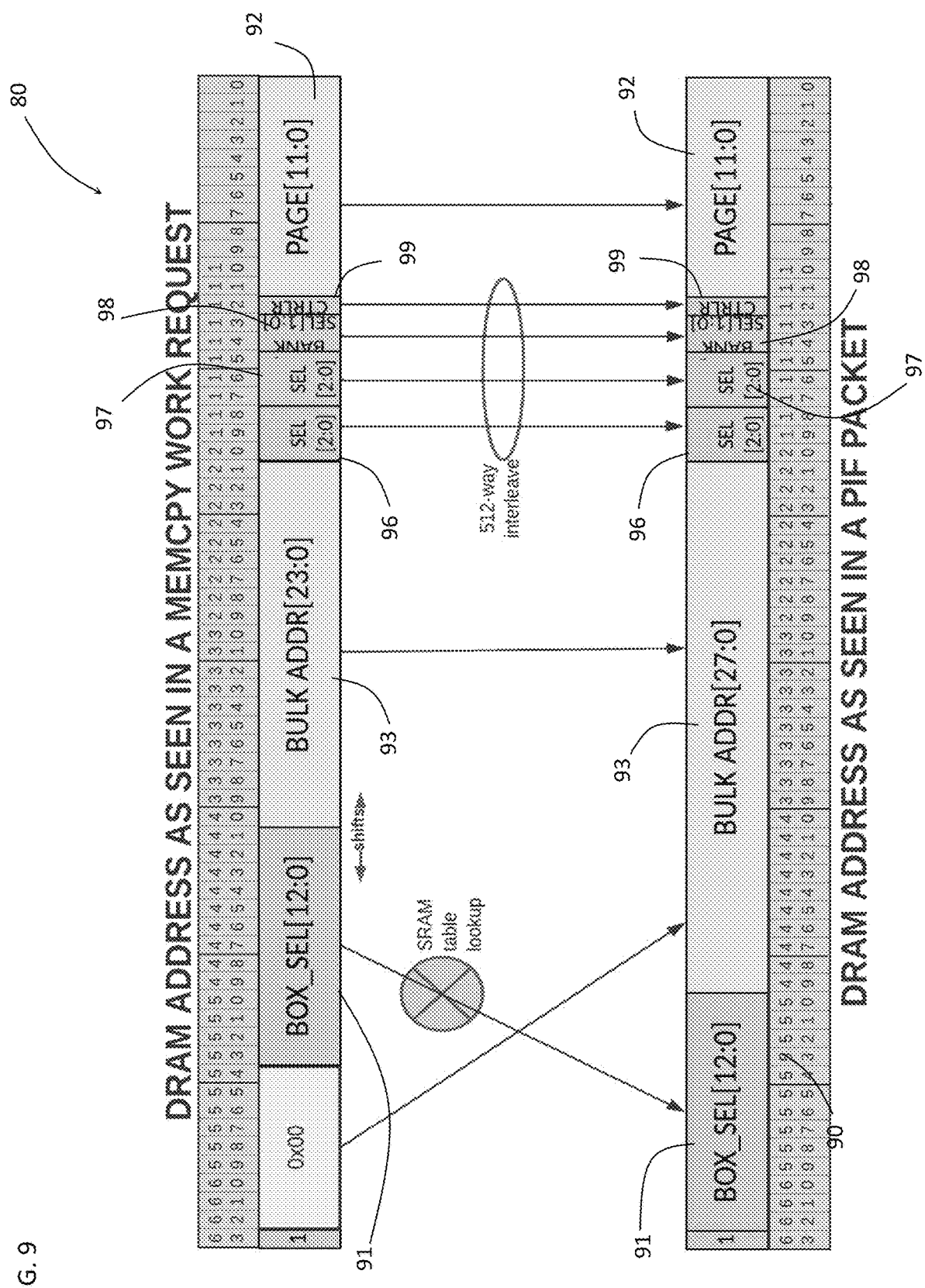
FIG. 9 is a schematic diagram of an exemplary MEMCPY work request packet transition to a PIF packet in accordance with the present disclosure.

With reference to FIG. 9, there may be a mapping step between the addresses supplied to the memory copy engine 75, i.e. the work request 80, and to the physical address translation step of the bridge device 5, i.e. PIF Packet 90. It is highly desirable for the compiler and software developers to see a contiguous DRAM address space across all the memory rack units 11 making up the computer system 1. As mentioned previously, the memory modules 21, e.g. DDR5 DIMMs, can be purchased in different capacities, e.g. 64 GB/DIMM or 256 GB/DIMM or multiples thereof, and possibly others. In looking at the addressing shown in FIG. 9, the address of the memory module 21 may be broken into two parts. The first field part 92 is the bits, e.g. 12 bits, addressing the bytes within a 4 KByte page. The second field part 93 is the BULK address which may allow the selection of any 4 KByte page within a selected memory module 21. Because the capacity of the memory modules 21 can vary, the number of bits in the BULK address field 93 can vary. The identification field 91 may be placed above all other fields so that, if a memory rack unit 11 fails, it can easily be removed from use. But this means the identification field 91 moves up or down in the, e.g. 64-bit, physical address depending on the number of bits in the BULK address field 93. A programmable shift amount may be applied to the addresses of the work request 80 and within the address translation (PIF Packet) 90 for the bridge device 5. Once the target sequential identification field 91 is extracted from the work request 80 it is looked up in a translation table. The result is the strictly contiguous address for a memory module 21 across all memory rack units 11 in the computer system 1 can be translated to discontinuous identification fields 91 in all of the memory rack units 11. This is a great simplification for all software running anywhere in the computer system 1, including in a, e.g. X86, host processor.

With further reference to FIG. 9, memory, e.g. DRAM, interleaving may be conducted between, e.g. 4K, pages in memory, e.g. DRAM, addresses. The work request 80 and the packet interface (PIF) packet 90 may also include a, e.g. 3 bit, switch device select field 96, a, e.g. 3 bit, a memory aggregation device select field 97, a, e.g. 2 bit, memory, e.g. DIMM, select field 98 and a, e.g. one bit, memory controller select field 99. The, e.g. 9 bits, form an, e.g. 512 way, interleave between the, e.g. 4K Byte, pages. Two sequential pages in the physical address may go to different memory, e.g. DRAM, controllers 52 and potentially to different memory modules 21, e.g. DIMMs, and potentially even to different memory aggregation devices 2. Considering the 4M Byte transfer example from above, all 512 sequential page requests are gone through before requesting a second 4K Byte page transfer from the same memory controller 52. For this example, each memory controller 52 handles exactly and only two 4K Byte page read requests, e.g. out of 1024 read requests total. Thus, the transfer time is essentially the time to transmit two 4K Byte pages. With this mechanism 4 MBytes of sequential data have been transferred in one read request 80. This is a phenomenal amount of data bandwidth, and it is thanks to the communication links 9, e.g. the pairs of optical and/or electrical links 900 and to the memory architecture. Also, the latency for transferring this huge data block is actually very small. The time to make a request and the time to get the first word from memory modules 21 via the memory aggregation device 2 back to the VPU 71 of the computational devices 3 is negligible compared to the 8 KByte transfer time. Thus, a completely uniform address space is provided as well. The 9-bits of switch device select field 96, the memory aggregation device select field 97, the memory select field 98 and the memory controller select field 99 are looked up in a translation table in the bridge device 5 and the computational device 3 so that interleaving can be optimized for both small or large data transfers or both.

The computer system 1 may define the format of all MEMCPY or DMA packets transferred over the communication links 9, e.g. the optical and/or electrical links 900. Each computational device 3 and each memory aggregation device 2 may include a plurality of the RX PIF modules 923, which receive, e.g. 56-bit, words from the communication links 9, e.g. the optical and/or electrical links 900, and translates them into data transfers for up to 4 (or more) KByte page transfers, i.e. for either read or write transactions. In essence, what flows in the packets on an optical and/or electrical link 900 is as if one took a 64-bit address/64-bit data memory bus and serialized it down the single bit lane of an optical and/or electrical link 900. That is essentially what the memory request packets look like that flow through the RF PIF modules 923. The RX PIF modules 923 may also manage error recovery if the FEC of the RX link layer 922 is unsuccessful. Inside each memory aggregation device 2, the RX PIF modules 923 may connect to an AXI bus which is connected to the two memory controllers 52 in each PHY connector 51. Recall that there may be four PHY connectors 51 in each memory aggregation device 2 and sixteen optical and/or electrical links 900 connected to each switch device 4. The eight communication links 9, e.g. pairs of optical and/or electrical links 900, may be divided between the 4 TX and RX PHY connectors 911 and 921 for simplicity. Accordingly, a first four communication links 9, e.g. optical and/or electrical links 900, may connect only to a first DRAM controller 52 on a first RX PHY connector 921, while a second four communication links 9, e.g. optical and/or electrical links 900, may connect only to a second PHY connector 921. This means that a switch may not be needed inside each memory aggregation device 2 to provide on-chip any to any connection, which is a huge simplification. Four communication links 9, e.g. optical and/or electrical links 900, are slightly faster than the two memory controllers 52 on one memory module 21 so performance is not degraded by this simplification.

Figure 10:
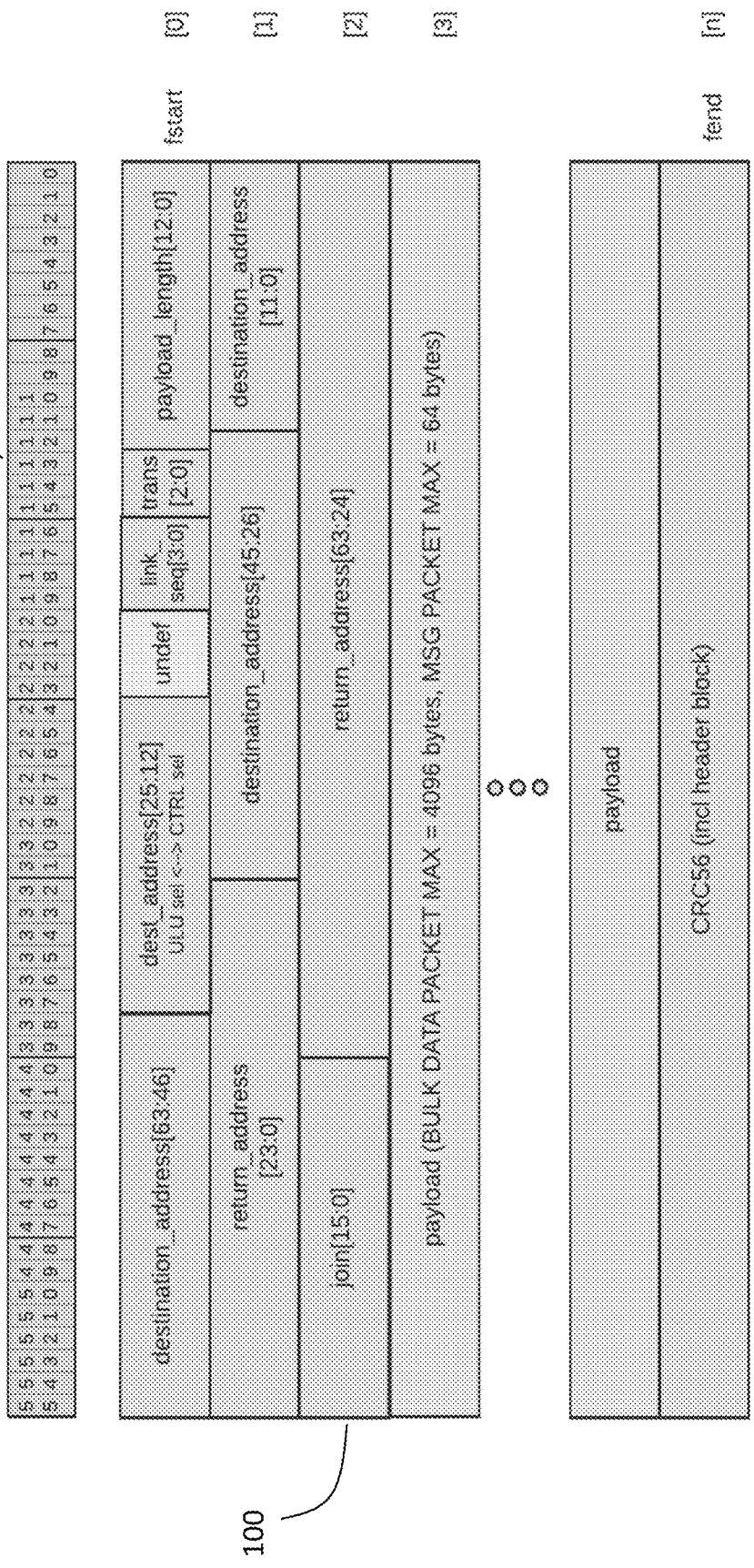
FIG. 10 is a schematic diagram of an exemplary MEMCPY protocol packet in accordance with the present disclosure.

Recall that a 4M Byte work request 80 can generate 1024 4 KByte page requests on the communication link 9, e.g. the optical and/or electrical links 900. The memory copy engine 75 may need to know when all of the 4 MBytes have been read or written, and may track this using the information in a JOIN field 100 of a memory protocol packet 101, as seen in FIG. 10. The contents of the join field 100 in requests are generated from the memory copy engine 75. When a READ DATA packet or a WRITE ACKNOWLEDGMENT packet is received by a communication link 9, e.g. a pair of optical and/or electrical links 900, the information from the JOIN field 100 may be forwarded to the memory copy engine 75 that launched it. Data may be carried in the payload of either a READ_DATA packet or a WRITE REQUEST packet. The cyclic redundancy check (CRC) may be any suitable format, e.g. from CRC-32 to CRC-56 as different link error rate behaviors could get by with smaller CRCs.

Figure 11:
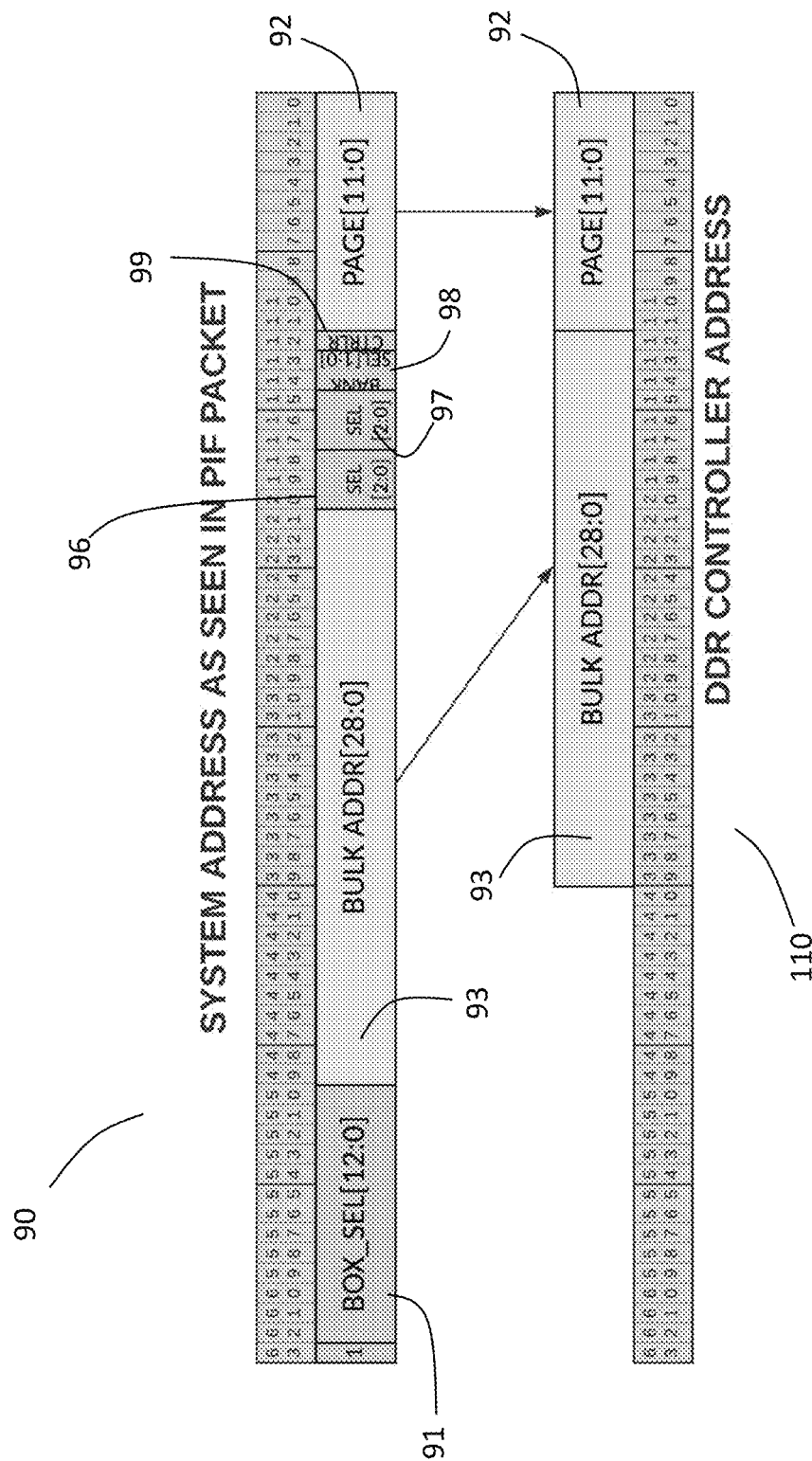
FIG. 11 is a schematic diagram of an exemplary PIF packet transition to a DDR controller address in accordance with the present disclosure.

With reference to FIG. 11, when a destination/target address is received by a memory aggregation device 2 in a PIF packet 90, the destination/target address may be converted to a full memory, e.g. DRAM, address 110 for the memory controller 52 by dropping the interleaving fields, e.g. 96-99, out of the middle, see FIG. 9. To one skilled in the art, moving the physical location of the interleaving fields to any location in a destination or return address field makes no difference, as long as the physical interleaving occurs on the appropriate page boundary. In this specific case, that page boundary is set at 4 Kbytes.

Figure 12:
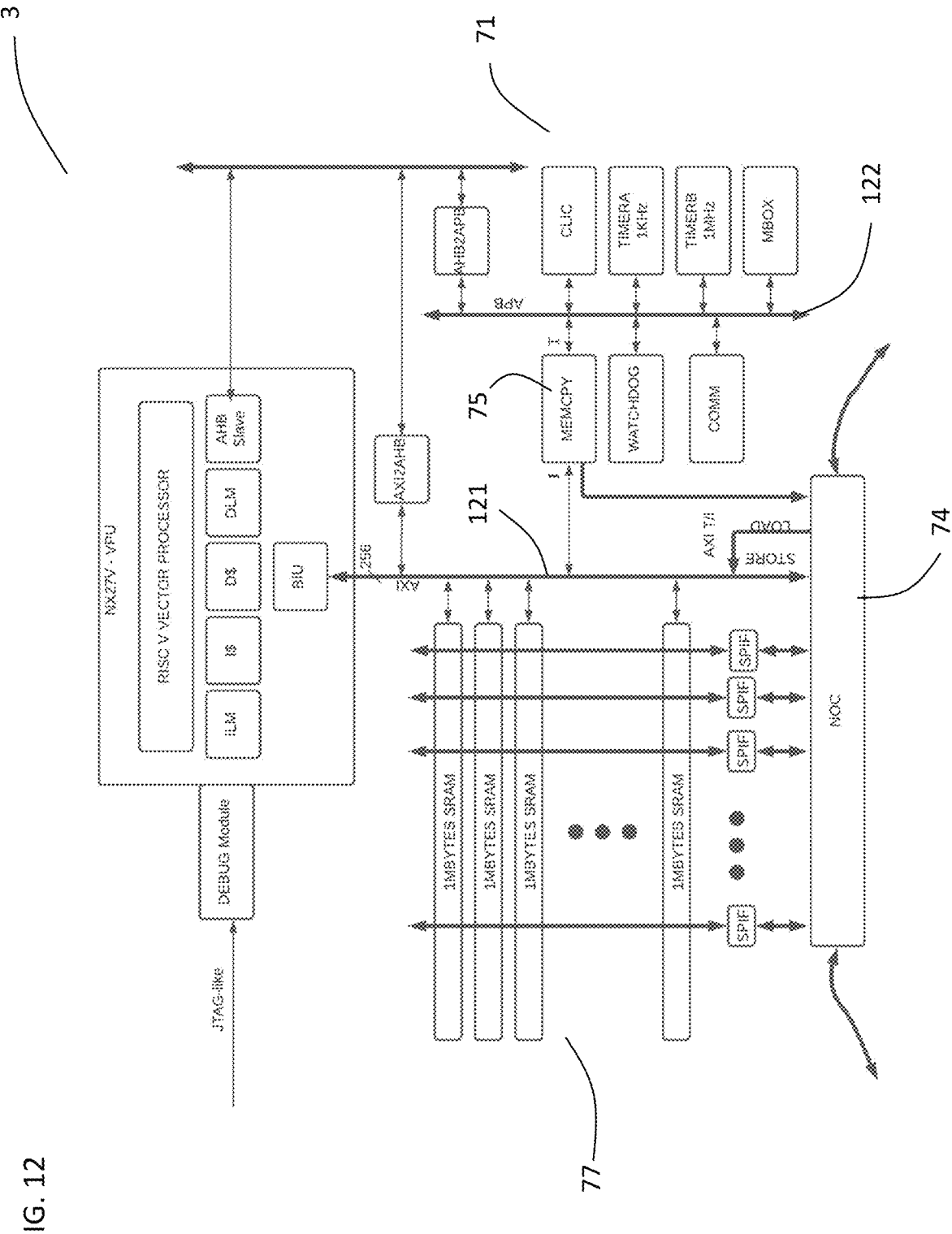
FIG. 12 is a schematic diagram of an exemplary computational device in accordance with the present disclosure.

With reference to FIG. 12, the memory copy engine 75, may connect to two busses within each VPU complex in each computational chip 3: the AXI bus 121 which gives the memory copy engine 75 direct access to the VPU SRAM 77 on that same AXI bus; and the APB peripheral bus 122 within the VPU complex. The VPU 71 reads and writes semaphore and other registers within the memory copy engine 75 over the APB bus 122.

Figure 13:
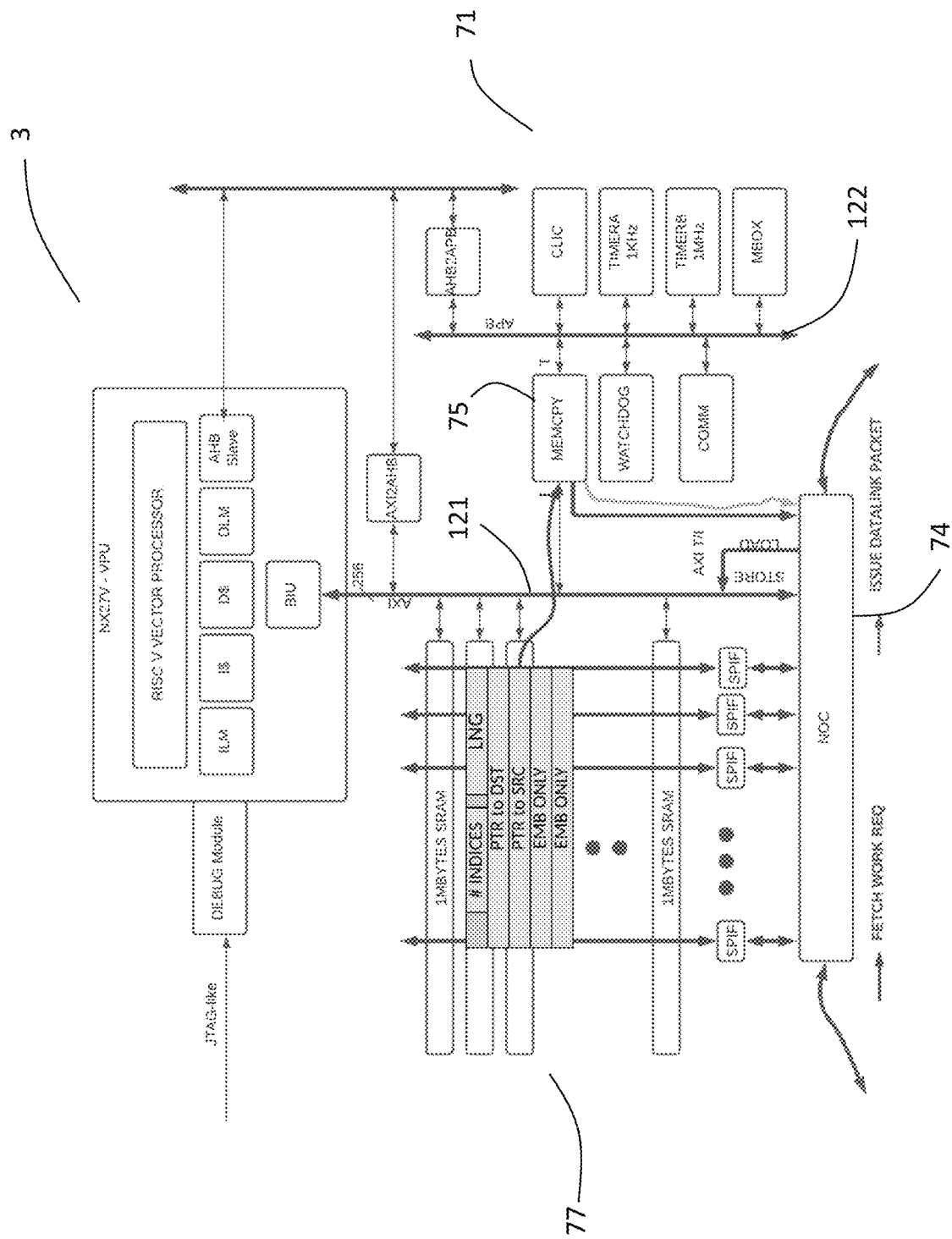
FIG. 13 is a schematic diagram of an exemplary computational device in accordance with the present disclosure.

With reference to FIG. 13, most of the information needed by the memory copy engine 75 comes in the form of work requests 80 which are read from the VPU SRAM 77.

When firmware in the VPU 71 wants to issue a work request 80 to the memory copy engine 75, the VPU 71 may first construct the work request structure in the command circular buffer in the VPU SRAM 77. Then the VPU 71 may simply increment a hardware semaphore in the APB interface 122 to the memory copy engine 75. If the memory copy engine 75 is idle or when it finishes a previous work request 80, the memory copy engine 75 may read the contents of the new work request 80 and load the new work request 80 into various internal working registers. As the memory copy engine 75 processes the new work request 80, the memory copy engine 75 may first translate the programmers view of the physical address to the optical and/or electrical link packet view. Next the memory copy engine 75 may break the work request 80 up into page boundary sized, e.g. 4K Byte, requests being careful to honor the necessary alignments. This means the first and last packets could be shorter than the page boundary, e.g. 4K Bytes. Then the memory copy engine 75 generates a plurality of packets and issues them to the NOC 74. Depending on the source of the data (WRITE request or READ request) the packets may travel to other on-chip destinations on the NOC 74, or they leave the computational device 3 through one of the TX lanes or the optical and/or electrical links 900. After each packet is emitted, the memory copy engine 75 increments the optical and/or electrical link addresses by the size of the previous packet and formats a new request. The memory copy engine 75 transmits the new request to the appropriate NOC target. For the 4 MB example from above, the memory copy engine 75 generates 3-word request packets as fast as it can and sends them over the NOC 74 to the appropriate one of the 128 communication link end points. The memory copy engine 75 can generate packets much faster than the on-chip SRAM 77 or external memory module 21, e.g. DRAM, can process the requests so the memory copy engine 75 can go idle waiting for completion. The memory copy engine 75 has a large bit vector which tracks completion of all outstanding optical and/or electrical link request packets. As join fields start coming in, the memory copy engine 75 resets the designated bit in the tracking bit vector. When they are all accounted for, the memory copy engine 75 sends an interrupt back to the VPU 71 and moves on to the next work request 80. There may be a plurality, e.g. 32, of VPUs 71 on a computational device 3 and each one has a memory copy engine 75. Even without VPU-VPU cooperation, there can be a never-ending flow of data to or from the optical and/or electrical links 900.

The memory copy engine 75 and the extremely high bandwidth of the optical and/or electrical links 900 enables tremendous lookup performance of embedding table rows. The memory copy engine 75 can process the offset (index) table directly and copy embedding table rows from random locations in the memory modules 21 (DRAM) into the on-chip Global Memory (GM) 72 in sequential order. Consider an embedding table lookup with 16K Entries in its offset table. The memory copy engine 75 of one VPU 71 can read a portion of that offset table by launching a single request packet 80 for each row in the embedding table offset array and reading its portion thereof. Consider the 32-bit embedding table offsets in FIG. 14. Each offset is an index into a very large embedding table. The memory copy engine 75 can provide a mode in which it follows the embedding table offset array and reads embedding data row by randomly addressed row into a sequential array in the GM 72. With reference to an operation where the embedding table rows are 128 FP32 values (512 bytes), In order to copy a 512-byte row from one of the memory modules 21 (DRAM), a 64-bit physical address is required. The memory copy engine 75, generates the physical address by reading a base address from the memcpy work request pointer 82 (FIG. 15), which is used as the base physical address for the embedding table itself. Each offset is added to the physical address to get the absolute address of the embedding table row, from some random location in the memory module 21 (DRAM). Then a 512 byte work request 80 is launched by the memory copy engine 75 to that location in the memory module 21 and set the target to the next sequential location in the GM 72. This can go on for as long as there is space in the GM 72 or the work request 80 requires it. Some lookups are only a few rows while many are very large and have to be spread across many or all of the computational devices 3. The most significant bit (MSB) of an offset entry can be used to select one of two base addresses to use for the lookup. As a result, some rows can be sourced from the GM 72 itself or the VPU SRAM 77, while most are sourced from the memory modules 21 (DRAM), which may be beneficial for a very skewed or power law distribution of indices.

Figure 15:
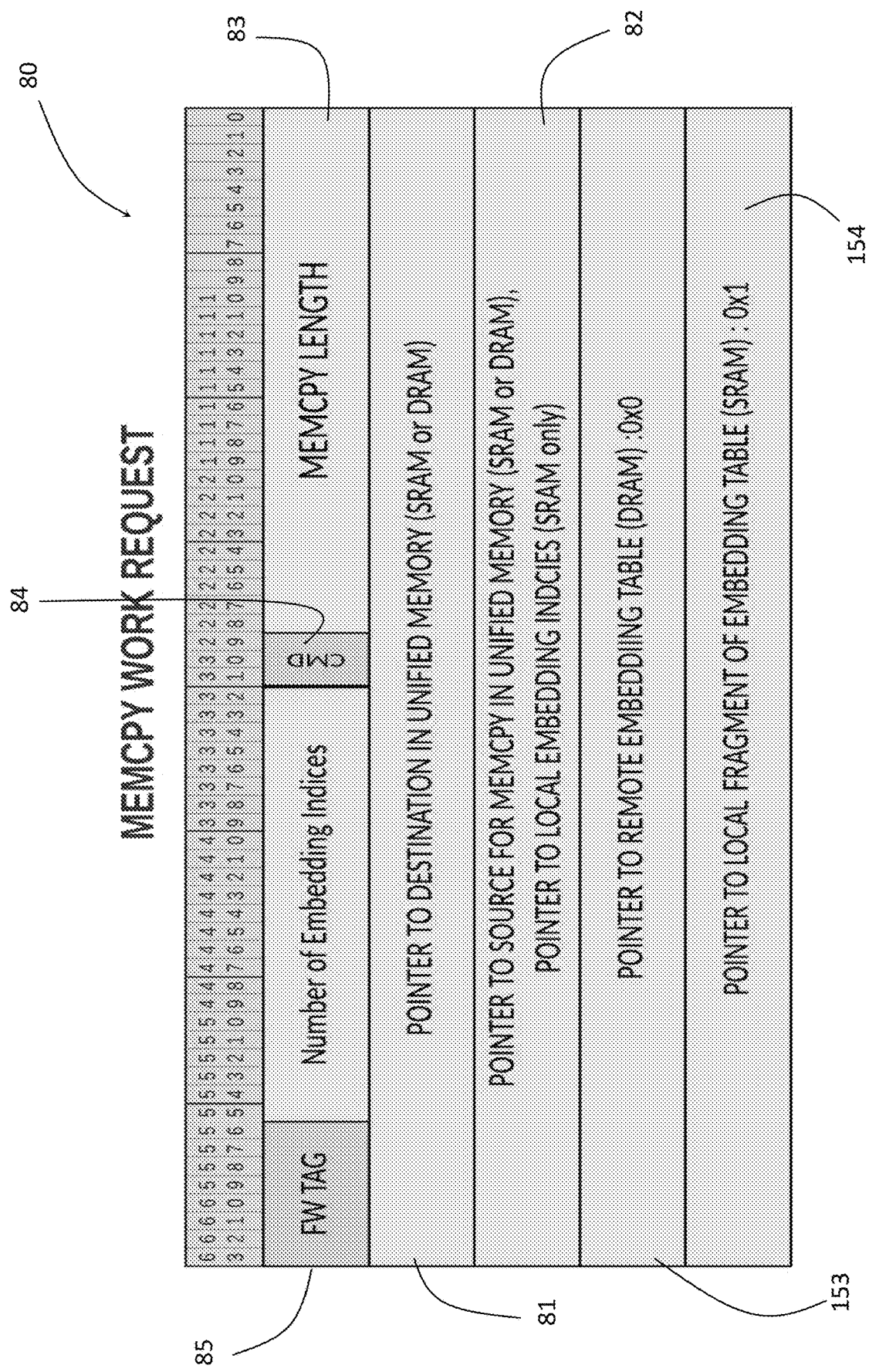
FIG. 15 is a schematic diagram of an exemplary MEMCPY work request packet in accordance with the present disclosure.

With reference to FIG. 15, which illustrates the structure of a VPU work request 80 for performing embedding lookups. Many fields may be essentially the same as a simple work request 80, which has a different command that says it is looking up embedding table entries. That command makes more fields available. The length field 83 may indicate the size of the embedding table row to be looked up. The number of embedding table indices is shown in the first word of the VPU work request 80. The standard destination pointer 81 is used but it is incremented by the length 83 as each MEMCPY or DMA packet is transmitted to the NOC 74. The second pointer 82 (source) may point to the location of the embedding table indices (offsets) somewhere in unified memory. The third pointer (memory) 153 may point to the location of the embedding table in the memory module 21, e.g. DRAM, although it could be anywhere in unified memory. The fourth pointer (computational) 154 can be used to implement a software cache in the GM 72 or VPU SRAMs 77. When the MSB of the offset entry is zero, then the first pointer 81 is used as a base. When the MSB of the offset entry is one, then the second pointer 82 is used as the base. It should be obvious to one skilled in the art, that alternative methods for identifying software cached embedding table rows can be indicated by using a comparator on offset indices and reserving the first N offset index values as cached offsets. In this case, one artificially adjusts the DRAM embedding table pointer, 153, to account for the N reserved indices for embedding table rows that are cached. Other approaches are equally viable, including the use of other markers with an offset to indicate additional base address values that could be provided within the mempcy work request 80. Finally other ways to indicate the size of the indices might be included in the CMD field 84 or other fields within the memcpy work request 80. This would allow different data types for the indices themselves, e.g 8-bit, 16-bit, 32-bit or. 64-bit. Very small embedding tables do not need 64-bit indices while extremely large embedding tables may require 64-bit indices".

Figure 16:
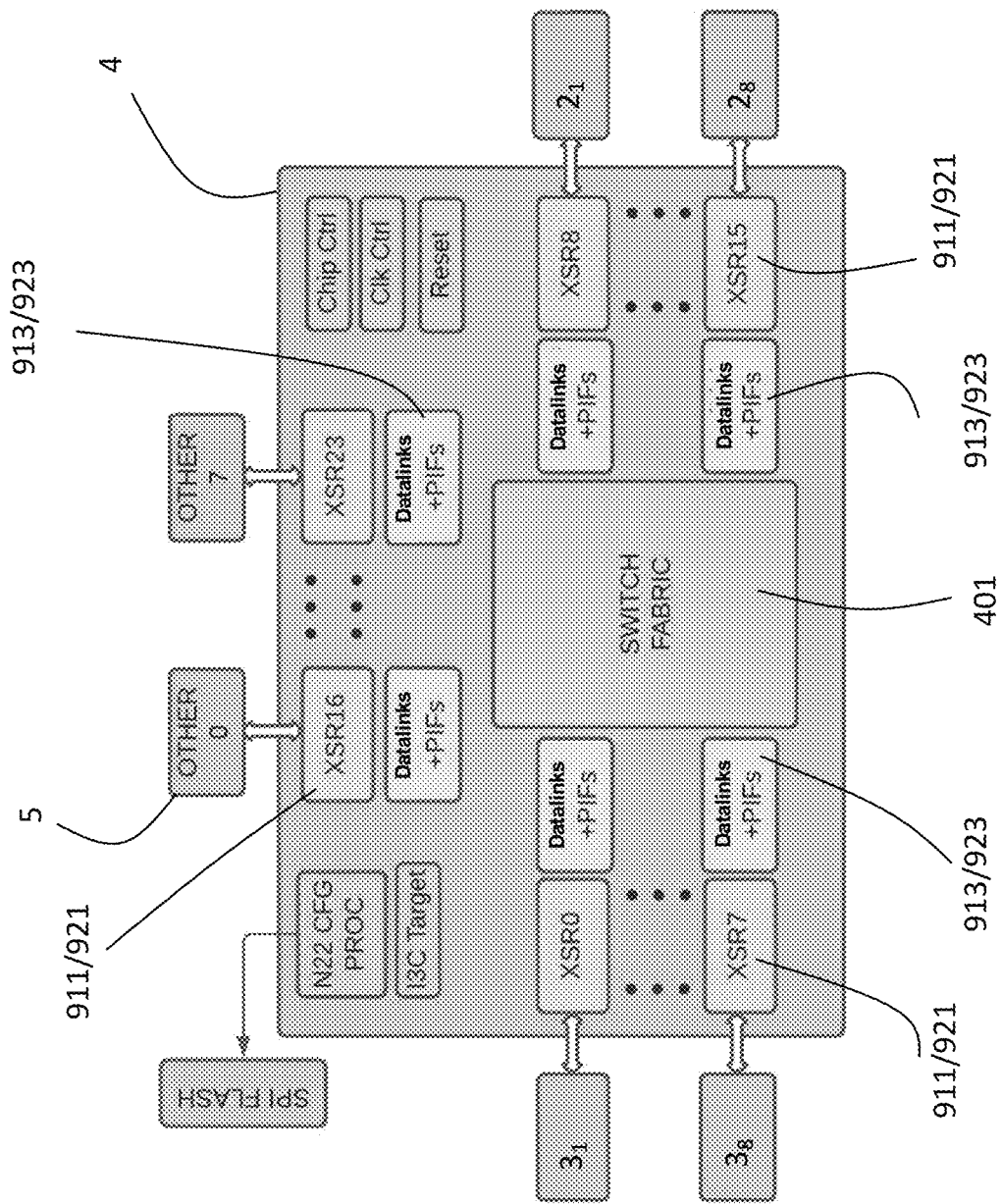
FIG. 16 is a schematic diagram of an exemplary switch device in accordance with the present disclosure.

With reference to FIG. 16, at a tier 1 position, i.e. within each memory rack unit 11, each switch device 4 connects to every computational devices 3 (8×), and to a fraction, e.g. one eighth (8×), of the aggregation devices 2. When there is a switch device 4 at the tier N position, where N>1, i.e. outside the memory rack units 11, all of the plurality, e.g. 384, of pairs of optical and/or electrical links 900 can be connected between the tier 1 memory devices 4 and the bridge devices 5 that enable all of the memory rack units 11 to connect to a standard data center LAN and SAN.

In the embodiment illustrated in FIG. 2, each switch device 4 connects to 8 memory aggregation devices 2. The 8 memory aggregation devices 2 occupy ½ of a DRAM board in the memory rack-unit 11. Accordingly, there can be 8 switch devices 4 and 8 half aggregation boards in a memory rack unit 11, i.e. 8 memory aggregation devices 2 per switch device 4. Accordingly, there may be 64 memory aggregation devices 2 and 8 switch devices 4 in one memory rack unit 11.

In multi-tier clusters of memory rack units 11, eight independent networks provide connectivity between eight Tier 1 switch devices 4 of every memory rack unit 11. Inside each memory rack unit 11, each computational device 3 is connected to every switch device 4 and each switch device 4 is connected to a specific memory aggregation device 2 board, i.e. 8 memory aggregation devices 2. To extend this connectivity beyond memory rack unit 11, it is sufficient for the switch devices 4 of the same tier to provide full bandwidth connectivity across multiple memory rack units 11.

FIG. 3 shows the Network plane-1 connecting all Tier 1 switch devices 4 through one-to-one connection to Tier 2 group-1 of switch devices 4. Each Tier 2 group comprises eight switch devices 4 connecting to every Tier 1 switch device 4 of the same rank in all memory rack units 11. Similarly, to extend Network plane-1 of 24 clusters of memory rack units 11 to three tiers, Tier 2 Group-1 of every cluster is connected through a Tier 3-Group 1 of switch devices 4. A total of 80 switch devices 4 in each T3-Group provide full connectivity and bandwidth support across 24 clusters of 10 memory rack units 11, for a total of 240 memory rack units 11.

Standalone two-tier clusters can have up to 23 memory rack units 11. The number of switch devices 4 in each Tier 2 group thereof depends on the number of memory rack units 11 they connect. To support full connectivity for each network, the switch devices 4 in one Tier 2 group should connect to all eight upstream photonic links 9 of each switch devices 4 of every memory rack unit 11 of their rank. Assuming that we have N memory rack units 11, the Tier 2 Group should support N*8 communication links 9. To provide bridge devices 5 access to every computation device 3 and memory aggregation device 2 in all memory rack units 11, one or more switch devices 4 connect the bridge devices 5 to every network by connecting them to one switch device 4 in every Tier 2 group of switch devices 4.

The rule of 16 states that all 16 pairs of optical and/or electrical links 900 emanating from one TX PHY 911 or received into an RX PHY 921 must come from exactly one other chip. One cannot connect eight pairs of optical and/or electrical links 900 from one PHY 911 or 921 to chip A and the other eight pairs to chip B. The rule of 16 is a hard restriction in the PHY receiver clock recovery. When all chips in the system are connected to their respective switch device 4, their individual optical and/or electrical links 900 must maintain a strict end-to-end order. For example, lane 0 from the optical and/or electrical link interface 901 at one end of the optical waveguide 903 always connects to lane 0 on the optical and/or electrical link interface 902 at the other end. Lane 1 connects to lane 1 and so on through lane 15. The rule of 16 applies to specific constraints with the SERDES 931/932 for the optical and/or electrical links 900. If one bases the links on a different SERDES protocol one might need to enforce a rule of only 8 or 4 or perhaps a rule of 32 might apply to some SERDES environments. In other embodiments, the rule of sixteen may not necessarily hold. For example, it may be possible to use smaller switch devices 4 that support less total bandwidth, provided that the switch radix remains large enough to support connectivity between various computational device 3, processors, various memory aggregation devices 2, and connectivity to other switch devices 4. For example, a switch device 4 supporting a total of 24×56 Gbps NRZ channels, or 1.34 Tbps of bandwidth (counted one way), can support the present embodiment described herein, provided that each channel can be directed to a different device.

FIG. 16 illustrates a top-level block diagram for an exemplary switch device 4 in which 24 pairs of TX PHY 911 and RX PHY 921 connect to other devices in the optical computer system 1. The switch device 4 provides any-to-any switching between any of the 24 devices connected to it. For example: the switch device 4 in tier 1 connects to: 8× computational devices 3; 8× memory aggregation devices 2; and up to 8× tier 2 switch devices 4 in a cluster of memory rack units 11. The switch device 4 in higher tiers, e.g. tier N (N>1), connects to: switch devices 4 in lower, e.g. N−1, tiers, or higher, e.g. N+1, tiers; and up to 16× bridge devices 5. In an exemplary memory rack unit 11, there are 8 switch devices 4 at tier 1 and one or more switch devices 4 at tier 2. The bridge device 5 can connect to the tier 2 switch devices 4.

The memory protocol packets 101 (FIG. 10) are transmitted serially over the photonic link 9. After, e.g. 7B/8B, encoding on the photonic link 9, only 56 bits (7 bytes) may remain of the usable data on each photonic link clock (1.75 GHz). Effectively, one 8-bit byte's worth of each 64-bit word at the SERDES 931 may be lost due to the line-encoding protocol; accordingly, a memory protocol packet 101 may arrive at the switch device 4 in 56-bit-wide words that the SERDES 932 is delivering or receiving, e.g. at 1.75 GHz. The 56-bit words are what are switched through the switch device 4. The packets are delivered to an egress port intact. That is, there is no preemption in the middle of the packet as it traverses the switch device 4 or leaves the egress port. Consequently, once the path is determined from ingress to egress, one packet flows in an uninterrupted fashion from ingress to egress. However, arbitration within the switch fabric 401 determines which packet gets the path to an egress port for the duration of one packet. Thus, the FSTART and FEND markers are passed through the TX PIF 913 and the RX PIF 923 and are used by the switch fabric 401 itself.

As described, each switch device 4 includes a plurality, e.g. 16, of switch planes. Each switch plane independently handles traffic from the plurality of, e.g. 25, ingress ports and routes that traffic to the plurality of, e.g. 25, egress ports. Each switch plane may contain a non-blocking switch fabric.

Figure 17:
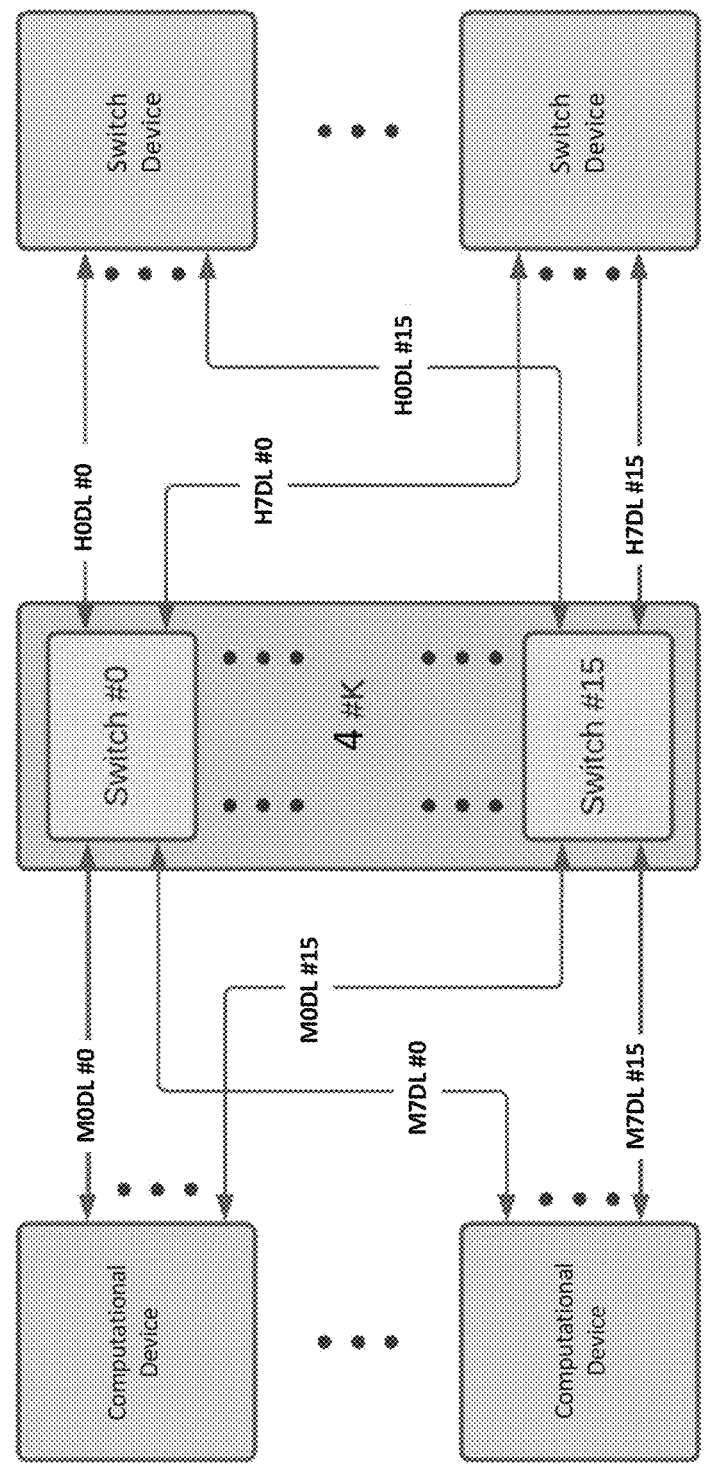
FIG. 17 is a schematic diagram of an exemplary switch plane in accordance with the present disclosure.

Ideally, the switch device 4 is configured to provide more connectivity than is necessary to provide the full any-to-any connectivity across all of the, e.g. 384, pairs of optical and/or electrical links 900. A switch-plane architecture as shown in FIG. 17, ensures that one photonic link 9, e.g. lane #0, of every computational device 3, memory aggregation device 2, and "other" devices, e.g. bridge device 5, is connected to a single (first) switch-plane, shown as Switch #0. Similarly, one photonic link 9 from each of the 24 devices connects to a second (and each of the other) switch-plane that would be labeled Switch #1. Finally, one photonic link 9, e.g. lane #15, from each of the 24 devices connects to the switch-plane labeled Switch #15. Preferably, no connection exists between any pair of switch-planes. The switch-plane architecture reduces a huge, e.g. 384×384, any-to-any switching problem to sixteen 24×24 switching problems. FIG. 17 illustrates switch-plane #7 in detail as a specific example, but the other 15 switch-planes look effectively the same, i.e. each of the computational devices 3 and each of the memory aggregation devices 2 supplies one of its 16 optical and/or electrical links 900 to switch-plane #7. Another optical and/or electrical link 900 may extend to each switch plane from a bridge device 5 directly or via a higher tier switch device 4.

One switch-plane is reduced to 24+1 ingress ports, each 56 bits wide, and 24+1 egress ports, also 56 bits wide. The packets that come in from an optical and/or electrical link 900 may be passed through the associated switch-plane and out of the subsequent egress port of the RX PIF 923 completely unchanged. Even the CRC32 of each packet may be unmodified as it passes through the switch device 4. At the working clock rates, the interface from the TX PIF 913 and RX PIF 923 in passthrough mode may be 224 bits wide, encompassing four of the 56-bit-wide data blocks.

Each switch plane from each switch device 4 may include an extra ingress port and an extra egress port, resulting in a total of 25 ingress ports and 25 egress ports. The 25th ports, i.e. the redundant ports, are not connected to the TX PHY 911 or the RX PHY 921 of the optical and/or electrical links 900. Instead, the extra ports provide for very limited switch-plan to-switch-plane redundant routing paths. These redundant ports are not intended for performance estimation and planning. They are there to provide alternate paths in the face of failing optical and/or electrical links 900. If during system test, it is discovered that two optical and/or electrical links 900 are failing in a multitier cluster or system such that some memory modules 21 is unreachable, then traffic can bypass the failing path. The interconnection scheme to the switch-planes is highly restricted. The redundant ingress port for switch-plane N is connected solely to the redundant egress port on switch-plane (N−1). Thus, traffic from a failing ingress port on switch-plane 7 can be routed to switch-plane 8 in this switch device 4 and then back to its normal path in the switch device 4 one tier above.

When a memory or work request packet 80 arrives at a switch device 4 from a photonic link 9, it contains two addresses: a destination address; and a return or source address. These addresses are unified memory addresses covering all of the optical computer system 1, e.g. up to 8192 memory rack units 11. The addresses can also be endpoint addresses, which allow access to VPU local SRAM 77 and peripherals or to components in the computational devices 3, e.g. scratch SRAM, computational-level peripherals, and the GEMM 76 itself.

When a packet arrives at an ingress port of the switch device 4, the switch device 4 needs to determine the egress port to which the message should be sent. Each ingress port uses simple logic (comparison) and three lookup tables to determine the egress port based on the destination address of the packet. The resulting value is integrated into either a switch header word on the front of the memory packet or a side channel on the flow. The switch header can contain other info, but basically it is a number between 0 and 24, inclusively, that tells the switch device 4 how to route the memory packet.

There is a common 13-bit box identification field 91 (FIG. 9) in any address that flows across a photonic link 9. It is the first thing examined by the switch device 4 to determine whether the packet is addressed to the memory rack unit 11 containing this switch device 4 or not. If not, the switch device 4 finds an egress port and sends the packet on to another switch device 4, e.g. in a higher tier, in the optical computer system 1. The switch device 4 is configured for looking up the BOX ID identification field 91 in its routing SRAM and prepending or attaching a switch header word on the front of the packet. The switch header can contain other info but basically it is a number between 0 and 24, inclusive that tells the switch device 4 how to route the packet.

The bridge devices 5 do not need to be associated with a specific memory rack unit 11 and its BOX ID identification field 91. A unique BOX ID identification field 91 may be assigned to each switch device 4 and use a CHIP ID to address all the bridge devices 5 connected to the same switch device 4. For non-endpoint switch devices 4 (Tier N switch devices 4, N>1), a BOX ID identification field 91 may be assigned that never matches any system address, such as a sequence of 1 s. This way the switch device 4 uses BOX ID identification field 91 to route the packet to the correct port based on the destination BOX ID identification field 91.

When there is a BOX ID identification field 91 match for switch device 4 connected to end-points, i.e. Tier 1 switch device 4 or Tier 2 switch device 4, then the address points to something inside the memory rack unit 11 or a connected bridge device 5 and all such destinations or sources are reachable over this switch device 4.

For intra-memory rack unit and intra-cluster packets, often more than one path is available. For example: Tier 1 switch device 4 can go through any of the 8 Tier 2 switches device 4 in the Tier 2-Group and Tier 2 switch devices 4 can go through any of the 10 connected switch devices 4 in Tier 3-Group. To simplify the routing, a fixed routing approach may be implemented whereby each ingress port uses a specific egress port to send data upstream (out of the cluster). For example, packets received from a computational device 3 or a memory aggregation device 2 only take a first upstream egress port to send data upstream. This may be handled within the table lookup mechanisms, which are unique to each ingress port. Recall that packets are only routed up if their BOX ID identification field 91 mismatches the tier 1 box id number.

Connectivity among bridge devices 5 may not be required. Bridge devices 5 that connect to the same tier of switch devices 4 are connected and can route using existing routing mechanisms, but different tiers of switch devices 4 may be connected and can route using existing routing mechanisms, but different switch devices 4 in the same cluster have limited connectivity. If all to all connectivity is desired, the cluster's switch devices 4 may be connected with point-to-point photonic links 9 as they are currently overprovisioned and have unused ports. As each switch device 4 has a unique BOX ID identification field 91, the existing routing can support routing intra/inter cluster bridge device 5 to bridge device 5 packets.

If the packet is addressed to a particular memory rack unit 11, the MSB of the destination address is examined by the switch device 4, e.g. bit [63]. If the MSB is a one, then the request is for a memory (DRAM) transaction. All memory (DRAM) transactions are mediated by the memory aggregation devices 2. So, in this case the request has to pass to an egress port connected to a memory aggregation device 2 from this switch device 4. As shown in FIG. 9, a memory address contains a memory aggregation device select field 97. These 3 bits are the only thing this tier 1 switch device 4 has to consider in making an egress port selection, that is, when the BOX ID identification field 91 match and the MSB=1. For redundancy reasons, the memory aggregation 2 lookup table address concatenates the 3-bit switch device select field 96 and the 3-bit memory aggregation select field 97. The lookup result provides the egress port to the memory aggregation 2 and may also specify that the memory aggregation select field 97 is over written. By the time a packet arrives at a switch device 4, a computational device 3 or a bridge device 5 has already determined to which tier 1 switch device 4 it goes upon leaving.

When software wants to use a load or store instruction to modify a single word somewhere out in the unified memory (DRAM) space, it uses exactly the same representation that it would use to format a work request 80.

All throughout the software running on the optical computer system 1, the memory module (DRAM) addresses are viewed such that the memory modules 21 (DRAM) in all memory rack units 11 roll sequentially/contiguously throughout. Since the memory modules 21, e.g. DIMMs, come in various capacities, for example, 16 GB/DIMM, 64

GB/DIMM, or 256 GB/DIMM, then the BOX ID identification field 91 has to shift upward when a memory module (DRAM) address in a work request 80 is converted to a photonic link PIF packet address 90. In every case, the memory module (DRAM) addresses in a photonic link PIF packet 90 always have the BOX ID identification field 91 bits in the most significant bits of the address.

A tier 1 switch device 4 uses the three switch device SELECT bits 96, the three memory aggregation SELECT bits 97, and the two memory module (DIMM) select bits 98 in the PIF packet address 92 to pick an egress port to reach the desired memory aggregation device 2. Once the address is confirmed to be to one of the memory modules 21 (DRAM), then these bits may look up an egress port number in the memory aggregation lookup table, which in an exemplary embodiment is a 256-word-by-8-bit register file that is programmed at configuration time. Some of the bits are used in an operation that substitutes a redundant memory unit 21 (DIMM) and/or memory aggregation device 2 for a failing one. If a redundant memory module 21 (DIMM) is to be selected (lookup [7]) then a replacement memory aggregation select bit field 97 is substituted into the outbound packet.

The mapping of programmer viewed addresses to PIF packet formats may be performed by either initiators of the bridge device 5 or initiators of the computational device 3. Accordingly, by the time a packet reaches any switch device 4 it may already have been converted to the PIF packet format.

In an exemplary embodiment, after matching the BOX ID identification field 91, if the MSB of the destination address is a zero, then the packet is destined either for a computation device 3 attached to the Tier 1 switch device 4, or a bridge device 5 chip connected to an upper tire switch device 4. In either case, the switch device 4 looks at the CHIP ID field 181 to determine which egress ports need to be utilized to forward this packet off of the current switch device 4. See the six potential non-DRAM address formats in FIG. 18, all have their CHIP ID field 181 in the same bits.

Accordingly, the switch device 4 does not have to consider the address bits [39:0] in making this decision. At this point, the BOX ID identification fields 91 have been matched, so the switch device 4 can be configured to look up the 10-bit CHIP ID 181 from bits [49:40] in the chip routing table. This mechanism allows the switch device 4 to pass bridge device addresses out the appropriate upward-facing egress ports.

In order to route a packet through tier 1 switch devices 4, each ingress port may contain a routing table RAM that is indexed by one of the following: the switch device select field [2:0] 96, the memory aggregation select field [2:0] 97 and the memory module (DIMM) select field [1:0] field 98 for DRAM addresses; the CHIP ID [9:0] field 181 for endpoint addresses; and the BOX ID [12:0] identification field 91, if it is not for this memory rack unit 11. The table may contain, among other things, the egress port number to switch to; a selected memory aggregation redundancy mode; and which redundant memory module 21 (DIMM) to select. The "endpoint" address subfield 182 may be used on either a computation device 3 or a bridge device 5 once the packet has been delivered to that device.

In some exemplary embodiments, there may be exactly 25 egress ports from which to select a route off of a switch device 4. Thus the routing tables at an ingress port need to produce a 5-bit value that selects the egress port. So for box routing, an SRAM of 5 bits by 8192 words is needed or one of 20 bit by 2048 word SRAM. The CHIP ID lookup can be performed in parallel with a separate 5-bit×1024 or 20-bit× 256 SRAM or register file.

Similarly, when a packet arrives at an upper tier switch device 4 with a matching BOX ID 91, CHIP ID 181 lookup will provide the correct port that routes the message to the target bridge device 5.

Finally, selections of memory aggregation devices 2 can be performed in parallel by a, e.g. 8-bit-by-256-word, register file. Two of the 8-bit word addresses may come from the memory module (DIMM) select field 98 in a DRAM address 80, three may come from the memory aggregation device select field 97, and three more may come from the switch device select field 96. The decode rules enable a single memory module 21 (DIMM) to be replaced by a redundant memory aggregation device 2 and memory module 21 (DIMM) connected to this switch device 4. Five of the read data bits may select the egress port. Finally, the eighth bit may select the use of the redundant memory aggregation device 2.

In this exemplary embodiment, the remaining two bits may replace the memory module (DIMM) select field 98 in the memory module (DRAM) address forwarded to the egress port. When redundancy is selected, the memory aggregation device select field 97 is set to a redundancy setting, e.g. 3'b110. It is expected that the redundant memory aggregation device 2 will be connected to the bypass port on the memory aggregation device, e.g. number 7, on this switch device 4. That way, the memory aggregation device 2, e.g. number 7, can select the bypass port since its memory aggregation device target will be set to 7, but it will see a memory module (DRAM) address with something other than its target address.

Note that when an upper tier switch device 4 receives a packet destined to a memory module (DRAM) address, it needs to be routed to the appropriate network plane where it reaches the correct switch device 4 in the destination memory rack unit 11. This may be done similar to memory aggregation device selection at Tier 1, by using the switch device select field 96, the memory aggregation select field 97 and the memory module (DIMM) select field 98 to lookup the routing table.

Figure 19:
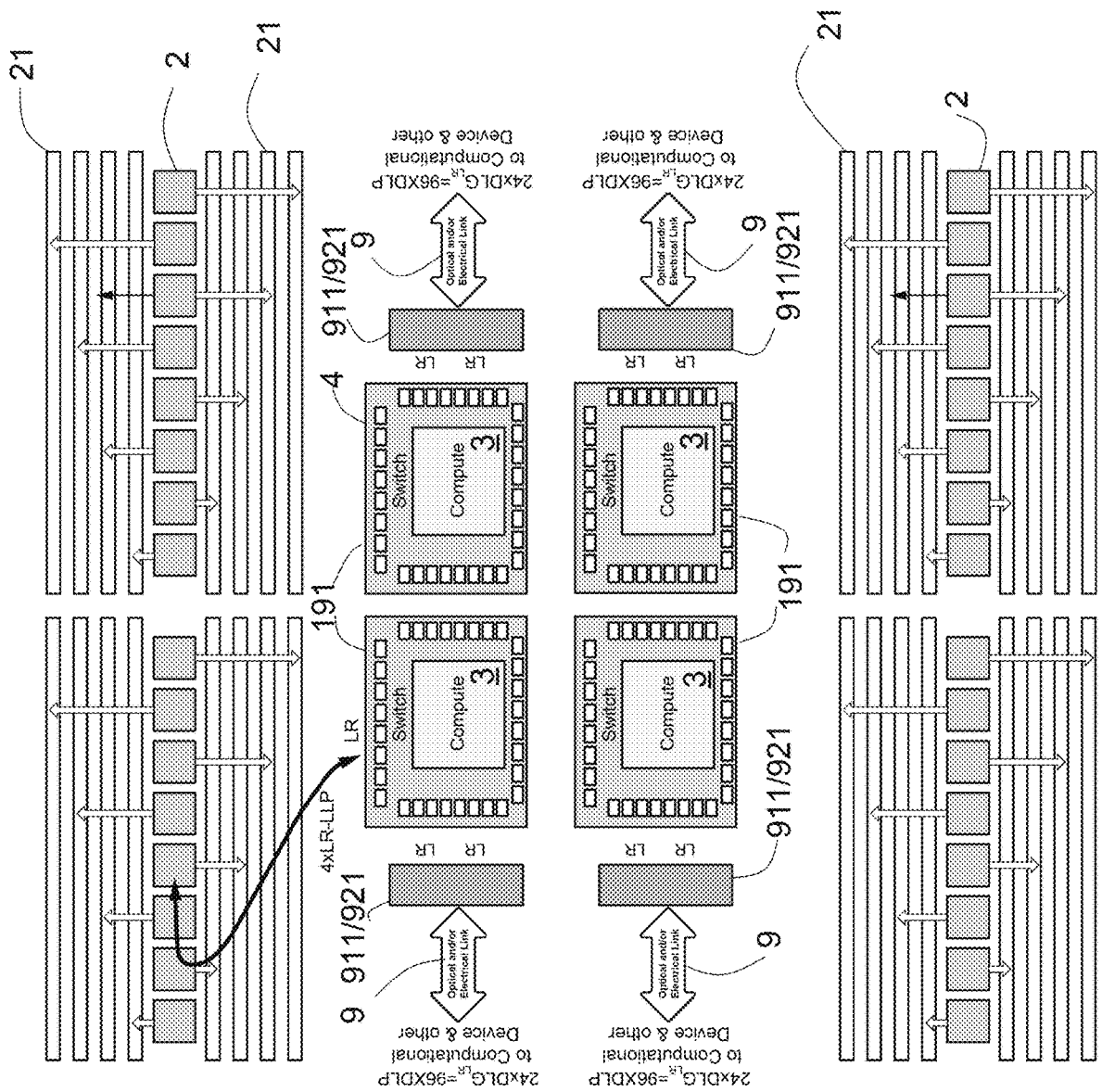
FIG. 19 is a schematic diagram of an exemplary optical computer system in accordance with the present disclosure in which switch devices are integrated on a same combination chip as at least one of the one or more computational devices

With reference to FIG. 19, the chips with the switch devices 4 in the computer system 1 tend to be perimeter or "shoreline" limited, which means a switch chip cannot get any smaller than a certain perimeter because of features that are at the edge of the switch chip or must be placed near the edges of the switch chip. This contrasts with a chip that is core limited, i.e. one that has so much interior logic and memory that the size of the chip is no longer determined by the size of features that must be placed at the shoreline. For example, a switch device 4 by its nature has a lot of connections to other chips. Each one of those connections must go to a switch or switch plane which is an any-to-any connection from ingress ports to egress ports. For very large numbers of discrete channel connections, these tend to be serial connections. To support these serial connections, a serializer/deserializer (SERDES) block 931/932 is connected to a physical interface block (PHY) 911/921. Each SERDES/PHY pair is typically placed at the edge or second or third ranked from an edge of the chip. Since the SERDES/ PHY pairs tend to be very large features in a chip, and since they must be placed at or near the edge of the chip, then the area of these pairs defines the length of the shoreline of the chip. Also, for a typical switch device 4, any ingress port, e.g. RX PHY 921, must be able to send a packet to any egress port, e.g. TX PHY 911.

The number of cross connections grows as the product of the number of ingress and egress ports 921/911. Consider a switch chip for a switching device 4 with 384 ingress ports and 384 egress ports this requires 384*384=147,456 cross connections. This is referred to as a radix 384 switch. With the memory copy architecture of the computation devices 3 and the memory aggregation devices 2 and the 64-bit unified address space, the switching device 4 can be split into, e.g. 16, switch planes, i.e. using the rule of, e.g. 16, PHYs. Each switch plan only requires a radix 24 switch to implement all required connections. Accordingly, the, e.g. 147,456, cross connection requirement drops, e.g. to 576 cross connections, in each switch plane and, e.g. a total of 9,216 cross connections for all 16 switch planes. The wiring complexity is proportional to the square of the radix.

Since each ingress port, e.g. RX PHY 921, only needs to connect to exactly 23 other egress ports, e.g. TX PHY 911, it is practical to just bus the ingress port data in one long source clocked data bus that runs around the periphery of the switch chip, whereby no paths cross through the middle of the switch chip. Accordingly, a big "donut" of routing is provided around the shoreline of each switch chip with a big hole in the middle thereof, i.e. white space. For a conventional any to any cross bar or NOC implementation, a lot of wiring in the 147,456 cross connections would have to cross through the middle of the chip eating up that white space.

For a typical chip for a switch device 4, with switch planes instead of a massive any-to-any cross bar the total area of SERDES/PHY pairs is larger than the area of the switch or switch plane logic and on-chip memory, thus these chips tend to have very empty centers. This empty space, sometimes called "white space", is unused in a switch, but the area it consumes must still be purchased as part of a wafer. For the most part this is just wasted space.

In contrast, chips for the computational devices 3 tend to be core limited since they have a very large logic and on-chip memory content and comparatively little interconnect requirement. Also, a stand-alone chip for a computational device 3 would typically connect to some kind of stand-alone switch chip for a switch device 4. One can see that there are significant advantages to combining these two chips into one combination chip 191, a switch device chip 4 plus a computational device chip 3, whereby the incoming and outgoing data is bussed in one source clocked data bus that runs around a periphery of each combination chip 191, whereby no paths cross through the middle of the combination chip 191.

This is true whether one is building switch+compute combination chips 191 or switch+compute combination chiplets, and the switch plane architecture of the switch device 4 makes the combination possible.

Combining the functions of the switch device 4 and the computational device 3 into one combination chip 191 provides extreme performance possibilities since every switch node in the system is also a compute node, whether it has chips/chiplets for memory aggregation devices 2 directly attached or not. In a lot of distributed computation systems, especially ones targeted at machine-learning-training applications, the data needed for the next processing step might be resident in the on-chip memory (SRAM or other) in a compute element (chip/chiplet). Thus, it is very likely that some of the input data will be coming from some place other than the memory aggregation devices 2. In this scenario, combining computational device 3 into a switch device 4 chip/chiplet is an extremely powerful architectural choice. The data flow graph for computation can be freely distributed across the network of switch+compute combination chips. When a processing sequence starts for a given model layer operation, its input data is simply copied across the network from the switch+compute combination chip 191 on which it resides. For most of these operations, data does not need to be written to memory aggregation chips 2, e.g. memory module 21 (DRAM) chips. Therefore, it doesn't have to be copied from a smaller number of high-density memory chips for the aggregation devices 2.

In addition, operators that require massive sharing of data from a single layer, e.g. all-gather, soft-max, batch-norm, all require the sharing of data that has just been created across all or most of the computing nodes. Having the computational device 3 directly connected to the first level of the switching device 4 allows the data to be sent in a very parallel form around the computational network of the computational device 3.

The high-density memory aggregation chips 2 provide storage for massive training data tables, embedding tables and other less frequently accessed but extremely large data sets. Having computation buried within the network itself, i.e. inside the very switch chips of the switching device 4 themselves means that model layer processing is literally free to move about the network of switch+compute combination chips 191.

The arguments above were made in favor of reclaiming unused area inside of a switch chip of the switching device 4, however, combining computation and network switching in the same node (or chip) is so powerful that one could readily choose to make such a chip even larger than the shoreline limitation outlined for switch chips above. That is to say, one may make switch+compute combination chips 191 that are intentionally larger than switch chips alone because of the network performance advantages of doing so. Even this combination is only realistic in an integrated switch+compute combination chip 191.

FIG. 19 shows both electrical and photonic high speed SERDES links being used in the same design. The connections between a memory aggregation device (chip) 2 and the switch device (chip) 4, which includes the computational device (chip) 3 mounted thereon, is close enough that photonics is not needed. Instead electronic connections, between the memory aggregation devices 2, the computational devices 3 and, when necessary, the switch devices 4, may be used, which saves the cost and power of a laser and a photonic interface chip. Four computational devices 3 are illustrated, but more or less, including just one, is within the realm of the invention. Yet it achieves the same bandwidth as a photonic connection. As the situation dictates you can use either electronic or photonic high speed serial interfaces to separate or disaggregate the high-capacity memory components from the compute components. This allows the creation of computation systems with orders of magnitude more capacity at comparable or better performance levels.

Figure 20:
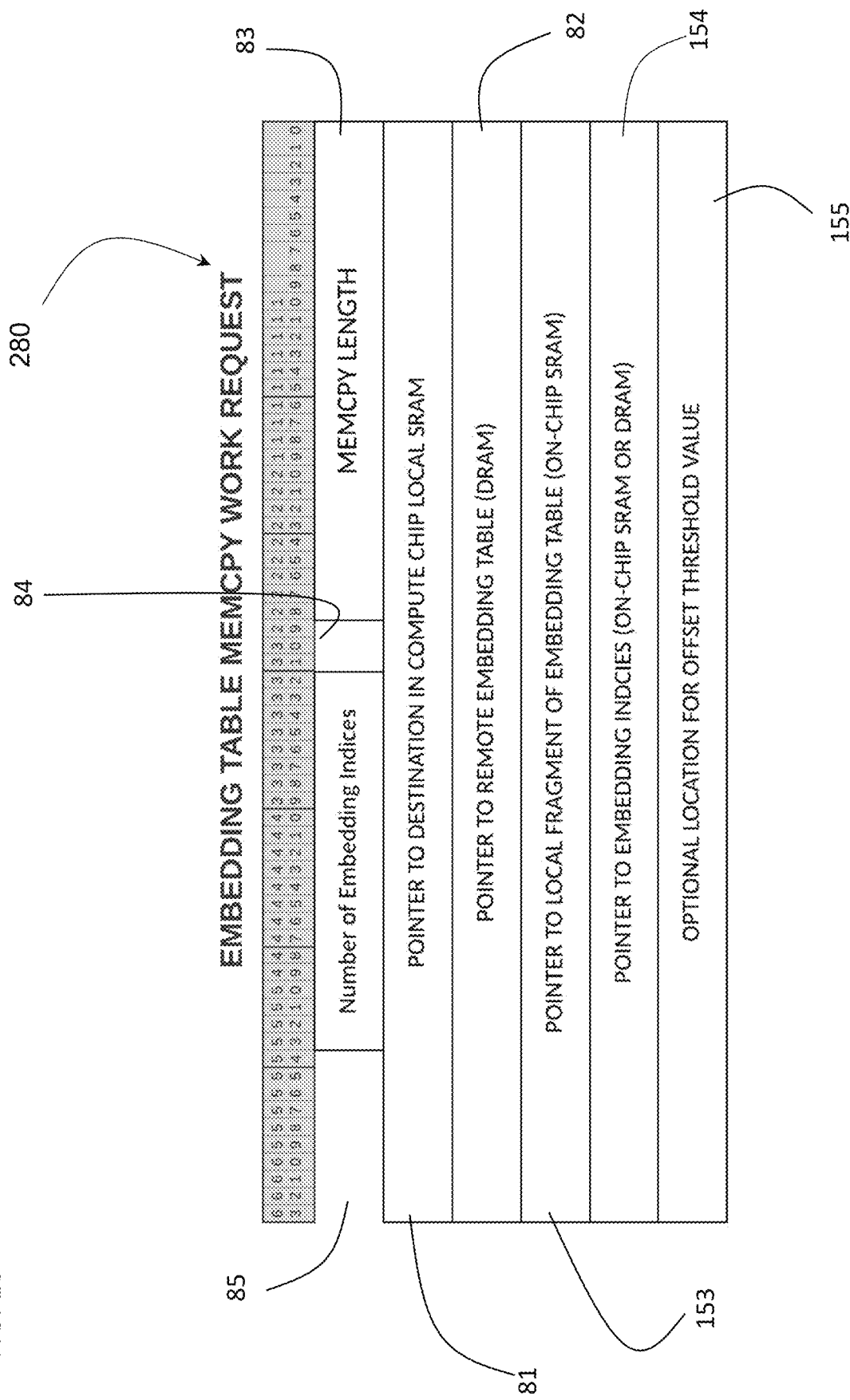
FIG. 20 is a schematic diagram of an exemplary MEMCPY work request packet in accordance with the present disclosure.
Figure 21:
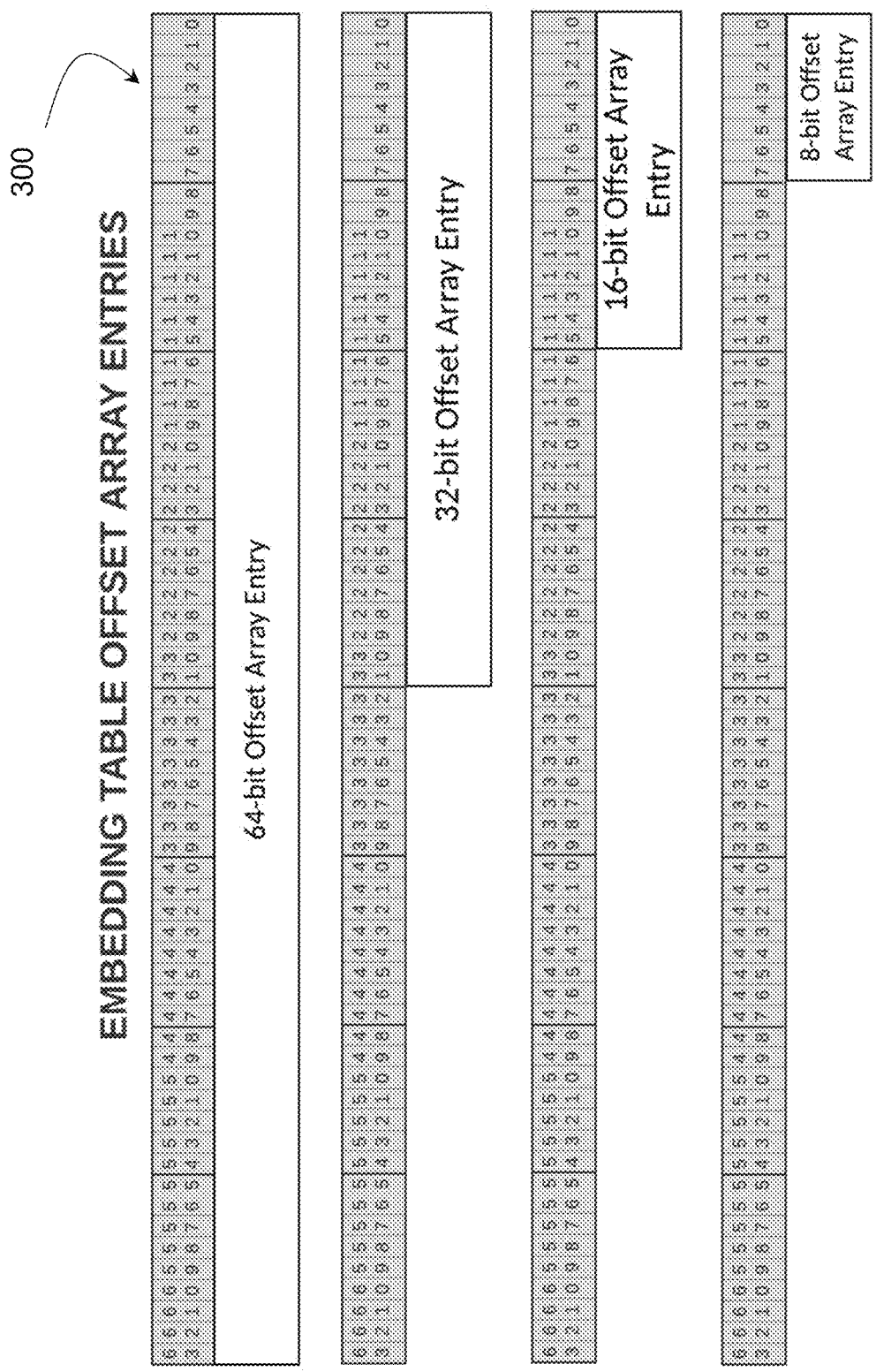
FIG. 21 is a schematic diagram of an exemplary embedding table in accordance with the present disclosure.

With reference to FIG. 20, which illustrates the structure of an alternative data access job 280 e.g. a VPU or MEMCPY work request, for performing embedding table lookups of an embedding table 300 (FIG. 21). Many fields may be essentially the same as a simple work request 80, which has a different command that indicates that it is looking up embedding table entries. That command makes more fields available. The length field 83 may indicate the size of the embedding table row to be looked up. The number of embedding table indices to fetch or copy into sequential locations indicated by the first pointer 81 is shown in the first word of the MEMCPY work request 280. The standard destination or first pointer 81 is used as the target of the MEMCPY operation but it is incremented by the length 83 as each MEMCPY or DMA request packet is transmitted to the NOC 74. The second pointer 82 (source) may point to the location of the embedding table 300 in the memory modules 21, e.g. DRAM, although it could be anywhere in unified memory. The third pointer (computational) 153, which points to a local fragment of the embedding table 300 in the local memory, e.g. VPU SRAM 77 or MGM 72, which can be used to implement a software cache in the local memory. The fourth pointer (memory) 154 may point to the embedding table indices (offsets) somewhere in unified memory.

When the MSB of the offset entry is zero, then the second pointer 82 is used as a base. When the MSB of the offset entry is one, then the third pointer 153 is used as the base. It should be obvious to one skilled in the art, that alternative methods for identifying software cached embedding table rows can be indicated by using a comparator on offset indices and reserving the first N offset index values as cached offsets. In this case, one artificially adjusts the DRAM embedding table pointer (second) pointer 82, to account for the N reserved indices for embedding table rows that are cached. Other approaches are equally viable, including the use of other markers with an offset to indicate additional base address values that could be provided within the MEMCPY work request 280. Finally other ways to indicate the size of the indices might be included in the CMD field 84 or other fields within the MEMCPY work request 280. This would allow different data types for the indices themselves, e.g. 8-bit, 16-bit, 32-bit or 64-bit (See FIG. 6). Very small embedding tables do not need 64-bit indices while extremely large embedding tables may require 64-bit indices.

The data request (MEMCPY) engine 75 can perform more efficient copying of embedding table entries by following a list of offsets (indices). This hardware acceleration is for embedding lookups, which includes support for software caching of embedding table entries in the GOM (global on-chip memory) 72 or local memory, e.g. SRAM 77, of the processing units 3. To that end, an offset threshold register 155 may be provided in a register set of the data request (MEMCPY) engine 75 or as part of the data access job 280 (FIG. 5).

The EMB threshold register 155 sets a threshold between offset values that are found within the local memory, e.g. SRAM 77, of the processing units 3 and the range of offsets that are copied from embedding tables in the memory modules 21, e.g. DRAM. The data request (MEMCPY) engine 75 takes the next offset value from the index array and compares it to the threshold register. If the next offset value is less than or equal to the value of the threshold register 155 then the offset is looked up based on the pointer 153 to on-chip SRAM 77. If the next offset value is greater than the value of the threshold register then the offset is looked up using the pointer 82 to the memory modules 21, e.g. DRAM. Both of these pointers are carried in the work request 280. For each offset in the index array, the data request (MEMCPY) engine 75 formats packets of a MEMCPY request (s) 280 to copy that data embedding from a quasi-random location in the memory modules 21, e.g. DRAM, (or MGM software cache of the local memory) into an embeddings buffer in the MGM 72 of the processing unit 210. The embeddings are copied one after the other beginning at the location specified in the DESTINATION pointer 81 in the MEMCPY work request 280.

Accordingly, a threshold value is compared to each offset/index into the embedding table, whereby when the offset is less than or equal to the threshold the third pointer 153, e.g. pointer to local fragment of embedding table is used. When the offset is greater than the threshold register value then the embedding table entry (row) is found by applying the offset or the offset minus the threshold to the second pointer 82, i.e. pointer to remote embedding table in the memory modules 21 or other external memory. Accordingly, a software cache located in local/on-chip memory (SRAM) 77 can be greatly accelerated using burst transfers of the row lengths either in local memory (SRAM) 77 or external memory 21, as appropriate.

Finally it should be noted that the threshold value can be stored either in a programmable register as described above, or it can be specified as an additional field 155 in the work request 280.

The foregoing description of one or more example embodiments has been presented for the purposes of illustration and description. It is not intended to be exhaustive or to limit the invention to the precise form disclosed. Many modifications and variations are possible in light of the above teaching. It is intended that the scope of the disclosure be limited not by this detailed description.

We claim:

1. A computer system comprising:
   a plurality of memory aggregation devices configured to retrieve data from and store data in a plurality of random access memory modules forming a unified contiguous memory address space disaggregated from a processing unit;
   one or more computational devices configured for simultaneously launching a plurality of data signals including memory read and/or write requests for the data to the plurality of memory aggregation devices;
   a plurality of communication links, the plurality of communication links coupling each of the plurality of memory aggregation devices to each of the one or more computational devices for transferring the data therebetween;
   wherein the one or more computational devices are configured to read/write multiple read/write requests simultaneously in parallel across the unified contiguous memory address space in the plurality of random access memory modules via the plurality of memory aggregation devices.

2. The computer system according to claim 1, further comprising:
   bridge devices configured to connect to a computer motherboard interface configured for converting the data between electrical signals in packet form from a host computer and optical signals in packet form, compatible with the plurality of communication links.

3. The computer system according to claim 1, wherein the plurality of communication links connected to the plurality of memory aggregation devices provide substantially all of an available read/write bandwidth of the plurality of random access memory modules to be accessed simultaneously.

4. The computer system according to claim 1, wherein one or more of the plurality of communication links comprises a transmitter electrical link and a receiver electrical link.

5. The computer system according to claim 4, wherein one or more of the plurality of communication links comprises a transmitter optical and/or electrical link and a receiver optical and/or electrical link; and
   wherein each transmitter optical and/or electrical link and each receiver optical and/or electrical link comprises a serializer and a first transducer for converting the data from parallel electrical signals to serial optical signals for transmission on an optical waveguide; and a deserializer and second transducer for converting the serial optical signals into parallel electrical signals at the one or more computational devices and the memory aggregation devices.

6. The computer system according to claim 1, wherein each computational device includes one of a plurality of memory copy engine configured to move the data over the communication links from any memory in any of the one or more computational devices, the plurality of memory aggregation devices and the plurality of random access memory modules to anywhere in the plurality of random access memory modules.

7. The computer system according to claim 6, wherein each memory copy engine is configured to divide transfers of data into packets and to dispatch the packets over multiple communication links in parallel and substantially simultaneously to a plurality of the plurality of memory aggregation devices for uniformly storing in a plurality of the plurality of random access memory modules.

8. The computer system according to claim 6, wherein the one or more computational devices comprises at least 8 computational devices;
wherein the plurality of memory aggregation devices comprises at least 8 memory aggregation devices;
wherein each memory copy engine is configured to launch at least 16 of the memory read and/or write requests in parallel and substantially simultaneously to each memory aggregation device over the communication links there between.

9. The computer system according to claim 6, wherein at least some of the plurality of memory copy engines are co-located with processing cores that are configured to compute data.

10. The computer system according to claim 6, wherein at least some of the plurality of memory copy engines are co-located with bridge devices that are configured to communicate with other processors using a standard interface.

11. The computer system according to claim 6, wherein greater than ⅔ of available random access memory in the plurality of random access modules is accessible via the plurality of memory aggregation devices accessible via the plurality of communication links.

12. The computer system according to claim 6, wherein the communication links connected to each of the plurality of memory aggregation devices provide >⅔ of an available read/write bandwidth of the plurality of random access memory modules.

13. The computer system according to claim 6, wherein the plurality of memory copy engines are configured to access greater than ⅔ of an available read/write bandwidth of the plurality of random access memory modules in parallel and uniformly.

14. The computer system according to claim 6, wherein the plurality of memory copy engines are configured for memory interleaving, which is globally applied across all of the plurality of memory modules via the plurality of memory aggregation devices.

15. The computer system according to claim 14, wherein a total random access memory capacity across all of the plurality of memory modules via the plurality of memory aggregation devices is greater than 100 GB.

16. The computer system according to claim 6, wherein the plurality of memory copy engines are configured to access all of the plurality of memory modules via all of the plurality of memory aggregation devices in a unified, contiguous address space.

17. The computer system according to claim 16, wherein the plurality of memory copy engines are configured to read/write multiple requests in parallel to all of the plurality of memory aggregation devices across a unified contiguous memory address space in the plurality of memory modules.

18. The computer system according to claim 1, wherein the plurality of random access memory modules include 4-8 random access memory modules per memory aggregation device.

19. The computer system according to claim 18, wherein the plurality of random access memory modules comprise at least 100 GB of DRAM memory.

* * * * *